United States Patent
Lee et al.

(10) Patent No.: US 12,354,689 B2
(45) Date of Patent: Jul. 8, 2025

(54) ERROR CORRECTION CODE CIRCUIT, MEMORY DEVICE INCLUDING ERROR CORRECTION CODE CIRCUIT, AND OPERATION METHOD OF ERROR CORRECTION CODE

(71) Applicant: Samsung Electronics Co., Ltd., Suwon-si (KR)

(72) Inventors: Myungkyu Lee, Suwon-si (KR); Seongmuk Kang, Suwon-si (KR); Sunghye Cho, Suwon-si (KR); Daehyun Kim, Suwon-si (KR); Kyomin Sohn, Suwon-si (KR); Kijun Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 18/482,300

(22) Filed: Oct. 6, 2023

(65) Prior Publication Data
US 2024/0185942 A1    Jun. 6, 2024

(30) Foreign Application Priority Data

Dec. 1, 2022    (KR) .......... 10-2022-0166030

(51) Int. Cl.
*G11C 29/42*    (2006.01)
*G11C 29/14*    (2006.01)

(52) U.S. Cl.
CPC .......... *G11C 29/42* (2013.01); *G11C 29/14* (2013.01)

(58) Field of Classification Search
CPC ................. G11C 29/42; G11C 29/14
See application file for complete search history.

(56) References Cited

U.S. PATENT DOCUMENTS

| | | | |
|---|---|---|---|
| 6,662,333 B1* | 12/2003 | Zhang | G06F 11/1044 |
| | | | 714/E11.041 |
| 8,332,731 B1 | 12/2012 | Sforzin et al. | |
| 9,069,692 B2 | 6/2015 | Chu et al. | |
| 9,244,765 B2 | 1/2016 | Dror | |
| 10,439,644 B2 | 10/2019 | Ilani | |
| 10,574,267 B2 | 2/2020 | Langhammer | |
| 2014/0089768 A1 | 3/2014 | Fujiwara et al. | |
| 2015/0311920 A1 | 10/2015 | Wang | |
| 2018/0314586 A1* | 11/2018 | Artieri | H04L 1/0057 |
| 2024/0185942 A1* | 6/2024 | Lee | G11C 29/14 |
| 2024/0220363 A1* | 7/2024 | Kim | H03M 13/63 |

FOREIGN PATENT DOCUMENTS

KR    101267958 B1    5/2013

OTHER PUBLICATIONS

Lee et al. "Low-Complexity Parallel Chien Search Structure Using Two-Dimensional Optimization" IEEE Transactions on Circuits and Systems II: Express Briefs 58(8):522-526 (Aug. 2011).

* cited by examiner

*Primary Examiner* — Samir W Rizk
(74) *Attorney, Agent, or Firm* — Myers Bigel, P.A.

(57) ABSTRACT

A memory device includes a memory cell array and an error correction code (ECC) circuit. The ECC circuit, which is configured to correct an error in a data code read out from the memory cell array, includes: (i) a syndrome calculating unit configured to operate a plurality of syndromes based on the data code and an H-matrix, (ii) an error location detecting unit configured to generate an error vector based on the plurality of syndromes, and (iii) an error correcting unit configured to correct an error within the data code based on the error vector, and output corrected data.

20 Claims, 24 Drawing Sheets

FIG. 5A

| i | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|----|----|----|----|----|----|----|----|----|----|----|----|----|----|----|----|----|----|----|----|----|----|
| b4 | 0 | 0 | 0 | 0 | 1 | 0 | 0 | 1 | 0 | 1 | 1 | 0 | 0 | 1 | 1 | 1 | 1 | 1 | 0 | 0 | 0 | 1 | 1 | 0 | 1 | 1 | 1 | 0 | 1 | 0 | 1 | 0 |
| b3 | 0 | 0 | 0 | 1 | 0 | 0 | 1 | 0 | 1 | 1 | 0 | 0 | 1 | 1 | 1 | 1 | 1 | 0 | 0 | 0 | 1 | 1 | 0 | 1 | 1 | 1 | 0 | 1 | 0 | 1 | 0 | 0 |
| b2 | 0 | 0 | 1 | 0 | 0 | 1 | 0 | 1 | 1 | 0 | 0 | 1 | 1 | 1 | 1 | 1 | 0 | 0 | 0 | 1 | 1 | 0 | 1 | 1 | 1 | 0 | 1 | 0 | 1 | 0 | 0 | 0 |
| b1 | 0 | 1 | 0 | 0 | 0 | 0 | 1 | 0 | 0 | 1 | 0 | 1 | 1 | 0 | 0 | 1 | 1 | 1 | 1 | 1 | 0 | 0 | 0 | 1 | 1 | 0 | 1 | 1 | 1 | 0 | 1 | 0 |
| b0 | 1 | 0 | 0 | 0 | 0 | 1 | 0 | 0 | 1 | 0 | 1 | 1 | 0 | 0 | 1 | 1 | 1 | 1 | 1 | 0 | 0 | 0 | 1 | 1 | 0 | 1 | 1 | 1 | 0 | 1 | 0 | 1 |

$\alpha^i$    $GF(2^5)$

FIG. 10

$$\alpha^{p(2m+1)} = \alpha^{p2m}+1$$

| m-th pair | $\alpha^{p2m}$ | $\alpha^{p(2m+1)}$ |
|---|---|---|
| 0 | $\alpha^1$ | $\alpha^{18}$ |
| 1 | $\alpha^2$ | $\alpha^5$ |
| 2 | $\alpha^3$ | $\alpha^{29}$ |
| 3 | $\alpha^4$ | $\alpha^{10}$ |
| 4 | $\alpha^6$ | $\alpha^{27}$ |
| 5 | $\alpha^7$ | $\alpha^{22}$ |
| 6 | $\alpha^8$ | $\alpha^{20}$ |
| 7 | $\alpha^9$ | $\alpha^{16}$ |
| 8 | $\alpha^{11}$ | $\alpha^{19}$ |
| 9 | $\alpha^{12}$ | $\alpha^{23}$ |
| 10 | $\alpha^{13}$ | $\alpha^{14}$ |
| 11 | $\alpha^{15}$ | $\alpha^{24}$ |
| 12 | $\alpha^{17}$ | $\alpha^{30}$ |

ERROR CORRECTION CODE CIRCUIT, MEMORY DEVICE INCLUDING ERROR CORRECTION CODE CIRCUIT, AND OPERATION METHOD OF ERROR CORRECTION CODE

CROSS-REFERENCE TO RELATED APPLICATION

This application claims priority under 35 U.S.C. § 119 to Korean Patent Application No. 10-2022-0166030, filed Dec. 1, 2022, in the Korean Intellectual Property Office, the disclosure of which is incorporated herein by reference.

BACKGROUND

Embodiments of the present disclosure described herein relate to integrated circuit devices and, more particularly, to integrated circuit memory devices having error correction capability and methods of operating same.

A semiconductor memory device may include a volatile memory device, in which stored data disappear when a power supply is turned off, such as a static random access memory (SRAM) or a dynamic random access memory (DRAM), and a nonvolatile memory device, in which stored data are retained even when a power supply is turned off, such as a flash memory device, a phase-change RAM (PRAM), a magnetic RAM (MRAM), a resistive RAM (RRAM), or a ferroelectric RAM (FRAM). As will be understood by those skilled in the art, a DRAM is widely used as a system memory, a buffer memory, or a working memory of a computing system.

In addition, as the degree of integration of a DRAM is increased, the size of each of memory cells decreases, and a frequency of data errors in the memory cells increases. Accordingly, various error correction techniques for correcting errors in a DRAM device are being developed.

SUMMARY

Embodiments of the present disclosure provide an error correction code having improved reliability, but with simplified structure, and a memory device including the error correction code, and an operating method of the error correction code.

According to an embodiment, a memory device includes a memory cell array and an error correction code (ECC) circuit that corrects an error of a data code read out from the memory cell array. The ECC circuit includes a syndrome calculating unit that operates with a plurality of syndromes based on the data code and an H-matrix, an error location detecting unit that generates an error vector based on the plurality of syndromes, and an error correcting unit that corrects an error of the data code based on the error vector and to output corrected data. The error location detecting unit is configured to generate a 0-th error vector element corresponding to a 0-th field element by performing a 0-th error location operation on the 0-th field element among a plurality of field elements based on an error location polynomial, and to generate a first error vector element corresponding to a first field element based on a result of the 0-th error location operation.

According to an embodiment, an ECC circuit configured to correct an error of a data code stored in a memory device includes a syndrome generating unit that generates a plurality of syndromes based on the data code read out from the memory device and a H-matrix, an error location detecting unit that generates an error vector based on the plurality of syndromes and a plurality of field elements of the H-matrix, and an error correcting unit that corrects an error of the data code based on the error vector. The error location detecting unit includes a coefficient calculator that generates a plurality of coefficients used in an error location polynomial based on the plurality of syndromes, and an error vector generator that generates the error vector based on the plurality of coefficients. The error vector generator includes a plurality of pair checkers configured to perform an error location operation on a plurality of pairs. The plurality of pairs includes at least two field elements among the plurality of field elements. The at least two field elements included in each of the plurality of pairs may satisfy a predetermined condition.

According to an embodiment, an operating method of an ECC circuit includes generating a plurality of syndromes based on a data code, generating an error vector based on the plurality of syndromes, and correcting an error of the data code based on the error vector. The generating of the error vector includes generating a first error vector element corresponding to a first field element by performing an error location operation on the first field element based on the plurality of syndromes and generating a second error vector element corresponding to a second field element based on a result of an error location operation on the first field element. The first field element and the second field element may be set to satisfy a predetermined rule.

According to an embodiment, a configuring method of an ECC circuit includes determining a H-matrix composed of a plurality of field elements based on a length of a data code and an error correction capability, configuring the plurality of field elements of the H-matrix into a plurality of pairs based on a predetermined rule, and configuring an error location detecting unit based on the plurality of pairs. Each of the plurality of pairs includes at least two field elements among the plurality of field elements, and the at least two field elements included in each of the plurality of pairs are determined to satisfy the predetermined rule. The error location detecting unit includes a plurality of pair checkers configured to generate at least two error vector elements corresponding to each of the plurality of pairs.

BRIEF DESCRIPTION OF THE FIGURES

The above and other objects and features of the present disclosure will become apparent by describing in detail embodiments thereof with reference to the accompanying drawings.

FIG. 5A shows an example of a Galois field for designing a code used by the ECC circuit of FIG. 4.

FIG. 10 is a diagram for describing field elements respectively operated by a plurality of pair checkers of FIG. 8.

DETAILED DESCRIPTION

Figure 1:
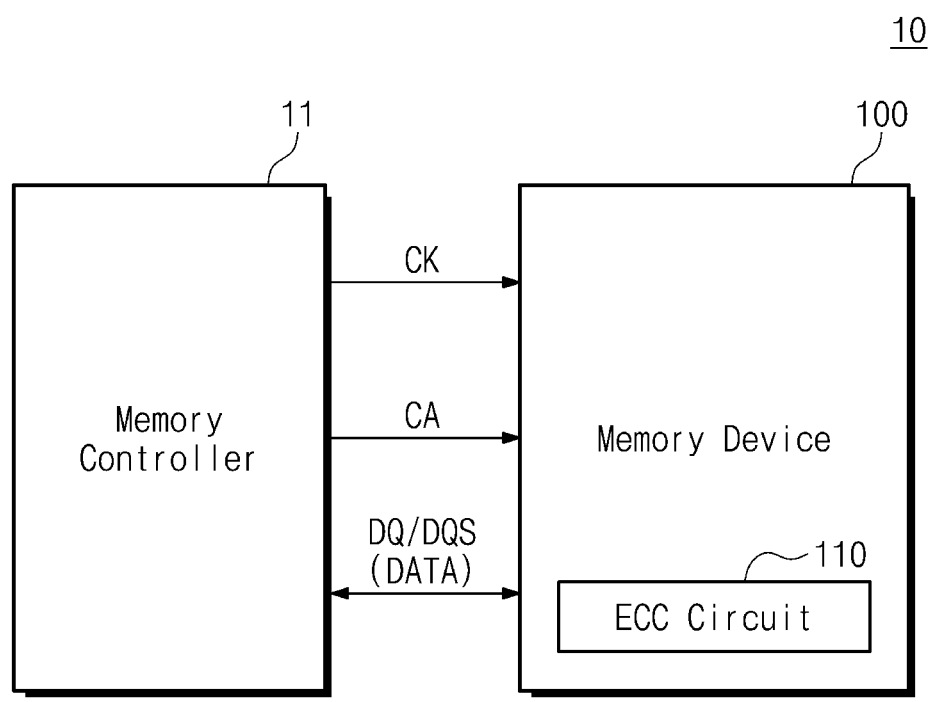
FIG. 1 is a block diagram illustrating a memory system, according to an embodiment of the present disclosure.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components. In addition, the term "unit" may include hardware circuitry for performing respective functions of a semiconductor system and/or device, and/or include one or more computer readable programs for performing respective functions herein.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a memory system, according to an embodiment of the present disclosure. Referring to FIG. 1, a memory system 10 may include a memory controller 11 and a memory device 100. In an embodiment, the memory system 10 may be one of information processing devices, which are configured to process a variety of information and to store the processed information, such as a personal computer (PC), a laptops, a server, a workstation, a smartphone, a tablet PC, a digital camera, and a black box. Alternatively, the memory system 10 may be a storage medium such as a solid state drive (SSD), and the memory device 100 may be used as a buffer memory of the SSD. However, the scope of the present disclosure is not limited thereto, and the memory system 10 may be implemented in various forms.

The memory controller 11 may store data in the memory device 100 or may read out data stored in the memory device 100. For example, the memory controller 11 may transmit a clock signal CK and a command/address signal CA to the memory device 100 and may exchange a data signal DQ and a data strobe signal DQS with the memory device 100. In an embodiment, through the data signal DQ and the data strobe signal DQS, data DATA may be transmitted from the memory controller 11 to the memory device 100 or may be transmitted from the memory device 100 to the memory controller 11. In an embodiment, the memory controller 11 and the memory device 100 may communicate with each other based on a DDR interface or an LPDDR interface, but the scope of the present disclosure is not limited thereto.

The memory device 100 may operate under control of the memory controller 11. In an embodiment, the memory device 100 may be a dynamic random access memory (DRAM) device, but the scope of the present disclosure is not limited thereto. For example, the memory device 100 may include a volatile memory such as an SRAM or a non-volatile memory such as a flash memory, a PRAM, and/or an RRAM.

In an embodiment, the memory device 100 may include an error correction code (ECC) circuit 110. The ECC circuit 110 may be configured to detect and correct an error(s) within data stored in the memory device 100. For example, the ECC circuit 110 may generate parity data by performing ECC encoding on first data received from the memory controller 11. The memory device 100 may store first data received from the memory controller 11 and parity data generated by the ECC circuit 110 together. While the memory device 100 is running, an error may occur in the first data stored in the memory device 100 due to various factors. When a read request for the first data is generated by the memory controller 11, the ECC circuit 110 may correct an error generated in the first data by performing ECC decoding based on the first data and the parity data corresponding to the first data. The memory device 100 may transmit the corrected first data to the memory controller 11.

In an embodiment, the ECC circuit 110 may correct errors within a predetermined error correction capability. When an error(s) occurring within data exceeds the error correction capability of the ECC circuit 110, the errors may not be corrected. As an example, an ECC circuit included in a DRAM device is configured to correct a 1-bit error. On the other hand, as the size of a DRAM device continues to become smaller, the number of error bits occurring in the DRAM device is increasing. Accordingly, the error correction capability of the ECC circuit 110 needs to be improved; however, when the error correction capability of the ECC circuit 110 is improved, the structure of the ECC circuit 110 may become too complicated.

In the present disclosure, an ECC circuit 110 having improved error correction capability and a relatively simple structure is provided. Embodiments of the ECC circuit 110 according to an embodiment of the present disclosure will be described with reference to the following drawings.

Figure 2:
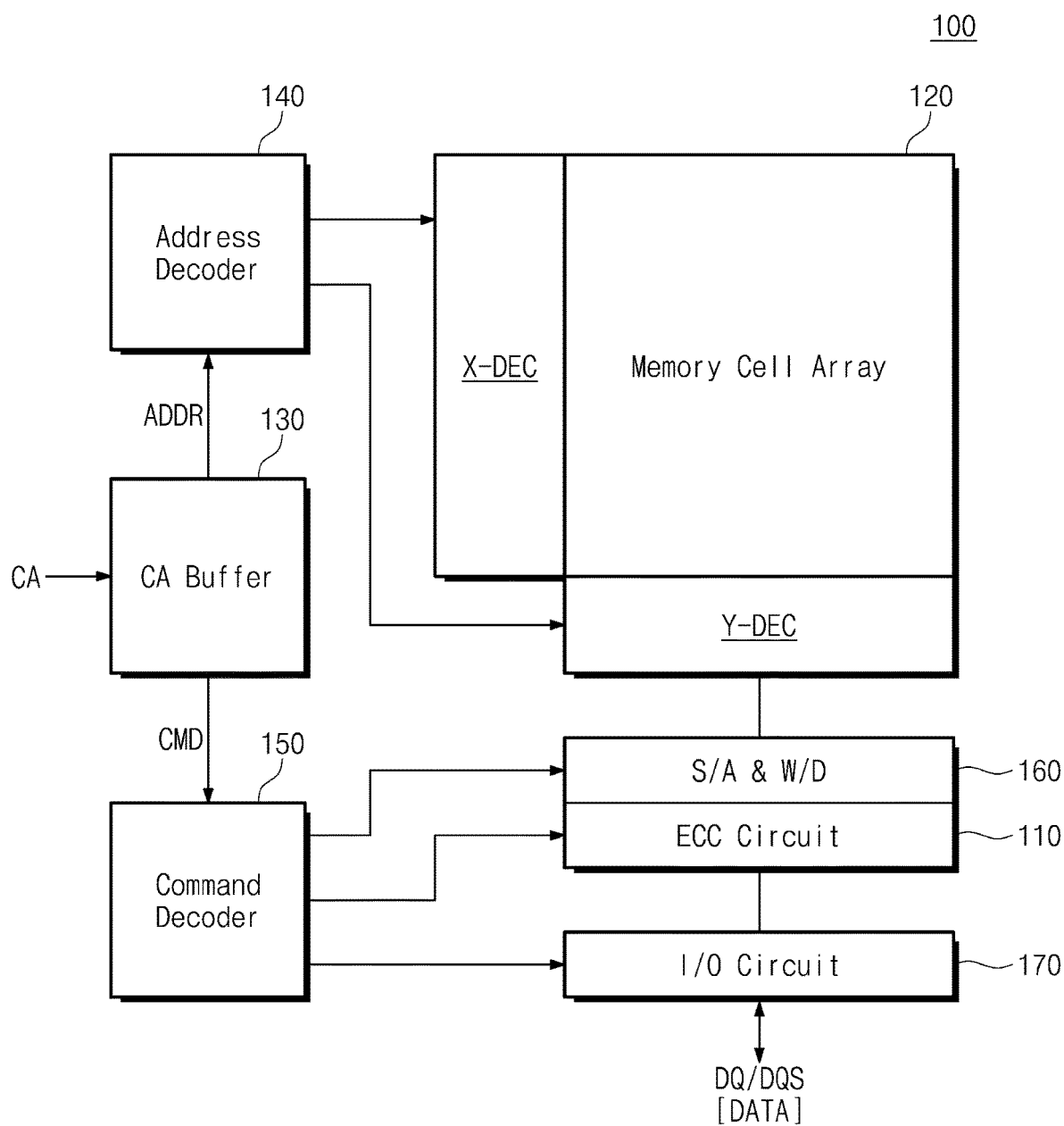
FIG. 2 is a block diagram showing a memory device of FIG. 1.

FIG. 2 is a block diagram showing a memory device of FIG. 1. Referring to FIGS. 1 and 2, the memory device 100 includes the ECC circuit 110, a memory cell array 120, a command/address (CA) buffer 130, an address decoder 140, a command decoder 150, a sense amplifier and write driver (S/A & W/D) 160, and an I/O circuit 170. The ECC circuit 110 may generate parity data by performing ECC encoding on data to be stored in the memory cell array 120. Alternatively, the ECC circuit 110 may correct an error of the data by performing ECC decoding based on the data and the parity data, which are read from the memory cell array 120. A configuration and an operation of the ECC circuit 110 will be more fully described with reference to the following drawings.

The memory cell array 120 may include a plurality of memory cells. The plurality of memory cells may be connected with a plurality of word lines and a plurality of bit lines. In an embodiment, the plurality of word lines may be driven by an X-decoder (or a row decoder) (X-DED), whereas the plurality of bit lines may be driven by a Y-decoder (or a column decoder) (Y-DEC). The CA buffer 130 may be configured to receive command/address signals CA and to temporarily store or buffer the received signals. The address decoder 140 may decode address signals ADDR stored in the CA buffer 130. The address decoder 140 may control the X-decoder and the Y-decoder based on the decoding result.

The command decoder 150 may decode a command CMD stored in the CA buffer 130. The command decoder 150 may control components of the memory device 100 based on the decoded result. For example, when a command signal stored in the CA buffer 130 is a write command (i.e., when a command received from the memory controller 11 is a write command), the command decoder 150 may control (i.e., perform ECC encoding) the ECC circuit 110 and may control (i.e., activate a write driver) an operation of the S/A & W/D 160 such that the data DATA received through the I/O circuit 170 is written into the memory cell array 120. In contrast, when a command signal stored in the CA buffer 130 is a read command (i.e., when a command received from the memory controller 11 is a read command), the command decoder 150 may control (i.e., preform ECC decoding) the ECC circuit 110 and may control (i.e., activate a sense amplifier) an operation of the S/A & W/D 160 such that data stored in the memory cell array 120 is read.

Under control of the command decoder 150, the S/A & W/D 160 may read out data from the memory cell array 120 through a plurality of bit lines or may write data into the memory cell array 120 through the plurality of bit lines. On the basis of the data signal DQ and the data strobe signal DQS, the I/O circuit 170 may receive the data DATA from the memory controller 11 or may transmit the data DATA to the memory controller 11.

Figure 3:
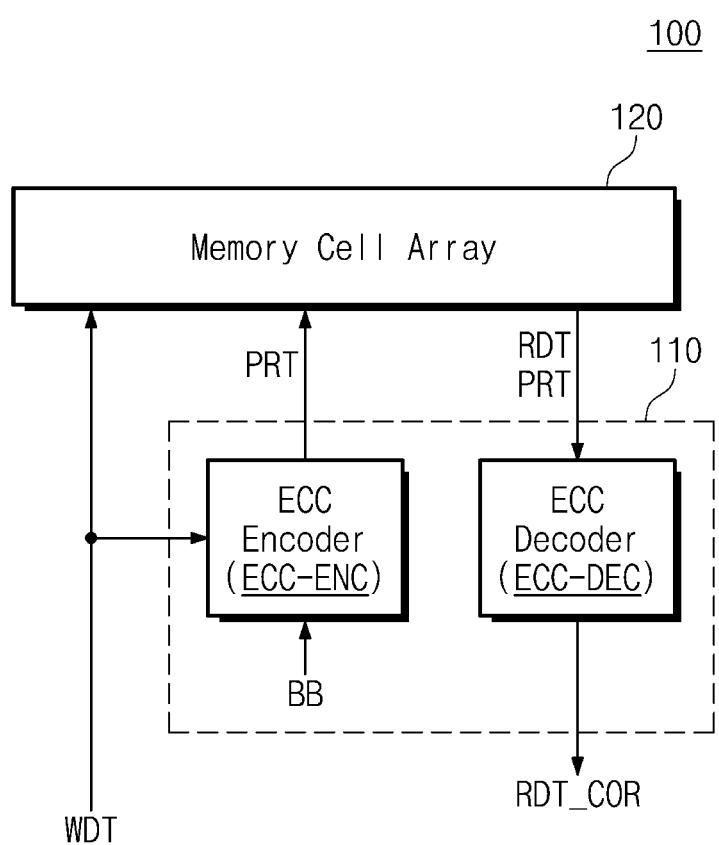
FIG. 3 is a diagram for describing an operation of the ECC circuit of FIG. 2.

FIG. 3 is a diagram for describing an operation of the ECC circuit of FIG. 2. For the sake of brevity and for ease of description, components that are unnecessary for describing an operation of the ECC circuit 110 are omitted to avoid redundancy. Referring to FIGS. 2 and 3, the ECC circuit 110 may include an ECC encoder ECC-ENC and an ECC decoder ECC-DEC. The ECC encoder ECC-ENC may generate the parity data PRT by performing ECC encoding on write data WDT to be stored in the memory cell array 120. For example, with regard to the write data WDT of 128 b, the ECC encoder ECC-ENC may generate the parity data PRT of 8 b by using basis bits BB of 8 b. The write data WDT and the parity data PRT may be stored in the memory cell array 120 through the S/A & W/D 160. In contrast, the ECC decoder ECC-DEC may output read data RDT_COR, in which an error is corrected, by performing ECC decoding based on read data RDT and the previously generated parity data PRT, which are read from the memory cell array 120.

Figure 4:
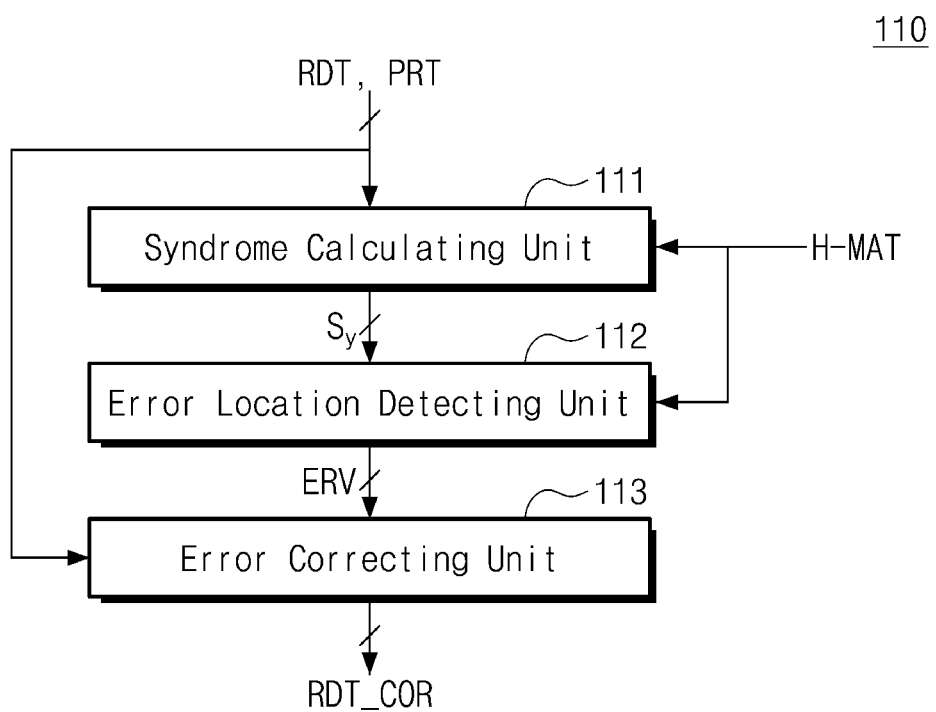
FIG. 4 is a block diagram for describing a configuration of the ECC circuit of FIG. 3.

FIG. 4 is a block diagram for describing a configuration of the ECC circuit of FIG. 3. Hereinafter, for convenience of description, it is assumed that the ECC circuit 110 may correct a 2-bit error. It is assumed that the ECC circuit 110 operates based on a Bose-Chaudhuri-Hocquenghem (BCH) code. However, the scope of the present disclosure is not limited thereto.

Referring to FIGS. 3 and 4, the ECC circuit 110 may include a syndrome calculating unit 111, an error location detecting unit 112, and an error correcting unit 113. The syndrome calculating unit 111 may calculate a syndrome $S_y$ based on the read data RDT and the parity data PRT, which are read from the memory cell array 120. For example, the syndrome calculating unit 111 may generate the syndrome $S_y$ by multiplying an H-matrix H-MAT by a data code including the read data RDT and the parity data PRT. In an embodiment, the syndrome $S_y$ may include vectors or bit columns including a plurality of bits depending on an implementation method of the ECC circuit 110. In an embodiment, according to the implementation method of the ECC circuit 110, there may be a plurality of syndromes $S_y$.

The error location detecting unit 112 may detect an error location generated in the read data RDT and the parity data PRT based on the syndrome $S_y$ and the H-matrix H-MAT and may generate an error vector ERV based on the detected error location. For example, the error location detecting unit 112 may generate an error location polynomial based on the syndrome $S_y$. The error location detecting unit 112 may extract a plurality of field elements from the H-matrix H-MAT and may determine a solution of the error location polynomial from the plurality of field elements. The error location detecting unit 112 may generate the error vector ERV based on the solution of the error location polynomial.

The error correcting unit 113 may be configured to correct an error of the read data RDT based on the error vector ERV and to output the corrected read data RDT_COR. In an embodiment, the error location detecting unit 112 may be configured to search for or calculate the solution of the error location polynomial based on a Chien-search algorithm. In this case, the error location detecting unit 112 according to an embodiment of the present disclosure may be configured to generate a pair for the plurality of field elements and to search for, or calculate, the solution of the error location polynomial in units of pair thus generated. In this case, the structure may be simplified without degrading the performance of the error location detecting unit 112 (i.e., the ECC circuit 110 or ECC decoder). Hereinafter, the error location detecting unit 112 according to embodiments of the present disclosure will be more fully described with reference to the following drawings.

Figure 5B:
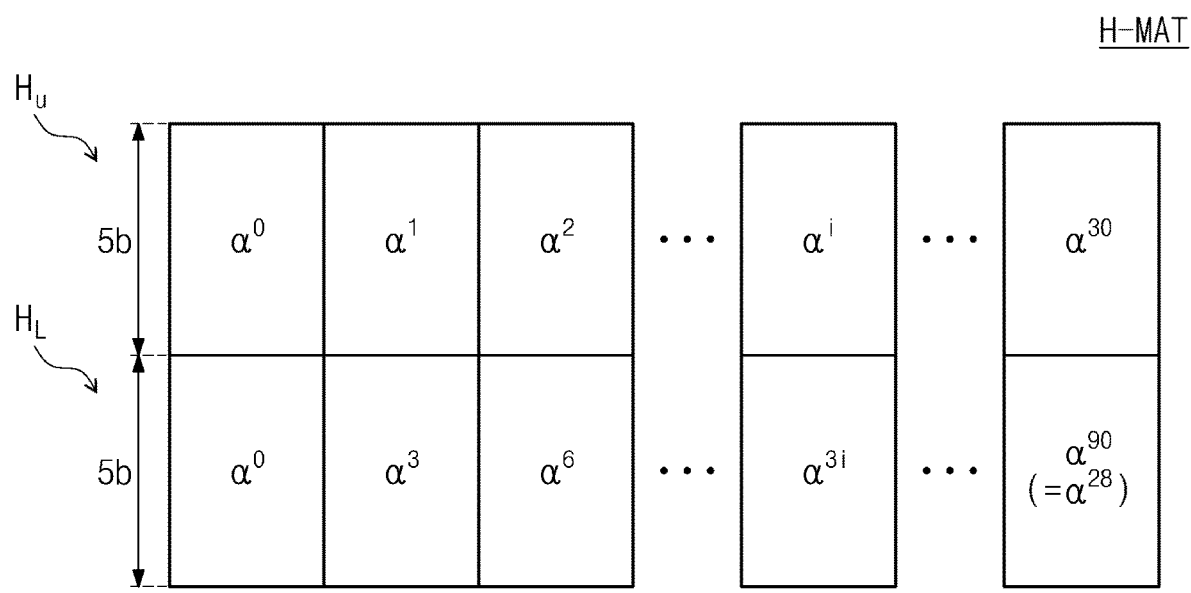
FIG. 5B shows an example of an H-matrix used by the ECC circuit of FIG. 4.

FIG. 5A shows an example of a Galois field for designing or forming a code used by the ECC circuit of FIG. 4. FIG. 5B shows an example of an H-matrix used by the ECC circuit of FIG. 4. In an embodiment, the ECC circuit 110 configured to correct a 2-bit error may use a BCH code. In this case, the H-matrix H-MAT used in the ECC circuit 110 that is capable of correcting a 2-bit error may be designed or formed based on field elements of a Galois field. For example, when a code having a code length of 31 bits is designed, field elements defined by a Galois field $GF(2^5)$ may be used. FIG. 5A shows an example of field elements $\alpha^0$ to $\alpha^{31}$ defined by the Galois field $GF(2^5)$. The Galois field $GF(2^5)$ shown in FIG. 5A may be defined by a formula of "$x^5+x^2+1$". In an embodiment, field elements $\alpha^0$ to $\alpha^{31}$ of the Galois field $GF(2^5)$ shown in FIG. 5A are provided as examples for describing embodiments of the present disclosure, and the scope of the present disclosure is not limited thereto.

As shown in FIG. 5A, one field element (e.g., each of $\alpha^0$ to $\alpha^{31}$) may be expressed as a 5-bit binary vector [b4, b3, b2, b1, b0]. In this case, a binary vector of each field element may be determined by a field value shown in FIG. 5A. According to an embodiment, the H-matrix H-MAT may be generated or designed by using the field elements $\alpha^0$ to $\alpha^{31}$ of the Galois field $GF(2^5)$ as shown in FIG. 5A. For example, the H-matrix H-MAT for a data code having a length of 31 bits may be designed as shown in FIG. 5B. As shown in FIG. 5B, the H-matrix H-MAT may include an upper portion matrix $H_U$ and a lower portion matrix $H_L$. The upper portion matrix $H_U$ may have a structure in which the field elements $\alpha^0$ to $\alpha^{31}$ of the Galois field $GF(2^5)$ are sequentially arranged in a column direction.

The lower portion matrix $H_L$ may be designed based on the upper portion matrix $H_U$. For example, each column of the lower portion matrix $H_L$ may be designed based on the corresponding column of the upper portion matrix $H_U$. In more detail, the 0-th field element $\alpha^0$ is arranged in the 0-th column of the upper portion matrix $H_U$. The 0-th field element $\alpha^0$ is arranged in the 0-th column of the lower portion matrix $H_L$. The first field element $\alpha^1$ is arranged in the first column of the upper portion matrix $H_U$. The third field element $\alpha^3$ is arranged in the first column of the lower portion matrix $H_L$. The second field element $\alpha^2$ is arranged in the second column of the upper portion matrix $H_U$. The sixth field element $\alpha^6$ is arranged in the second column of the lower portion matrix $H_L$. The i-th field element $\alpha^i$ is arranged in the i-th column of the upper portion matrix $H_U$. The 3i-th field element $\alpha^{3i}$ is arranged in the i-th column of the lower portion matrix $H_L$. The 30th field element $\alpha^{30}$ is arranged in the 30th column of the upper portion matrix $H_U$. A 90th field element $\alpha^{90}$ is arranged in the 30th column of the lower portion matrix $H_L$.

In an embodiment, as shown in FIG. 5A, the 31st field element $\alpha^{31}$ is the same as the 0-th field element $\alpha^0$. That is, field elements after the 31st field element $\alpha^{31}$ may be determined to circulate the 0-th to 30th field elements $\alpha^0$ to $\alpha^{30}$ (e.g., $\alpha^{31}=\alpha^0$, $\alpha^{32}=\alpha^1$, $\alpha^{33}=\alpha^2$, or the like). Thus, based on this example, the 90th field element $\alpha^{90}$ may correspond to the 28th field element $\alpha^{28}$.

The Galois field $GF(2^5)$ and the H-matrix H-MAT described with reference to FIGS. 5A and 5B are simple examples for easily describing embodiments of the present disclosure, and the scope of the present disclosure is not limited thereto. It will be understood that the design of the H-matrix H-MAT may be modified in various ways depending on the implementation method of the ECC circuit 110, an error correction capability, a length of a data code, or the like.

Figure 6:
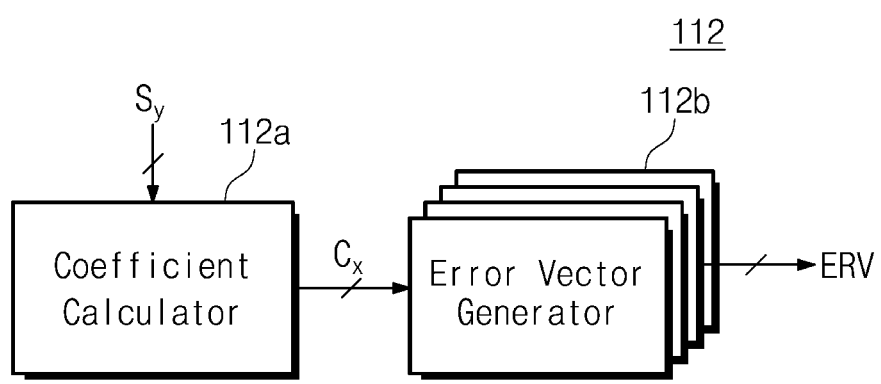
FIG. 6 is a block diagram showing an error location detecting unit of FIG. 4.
Figure 7A:
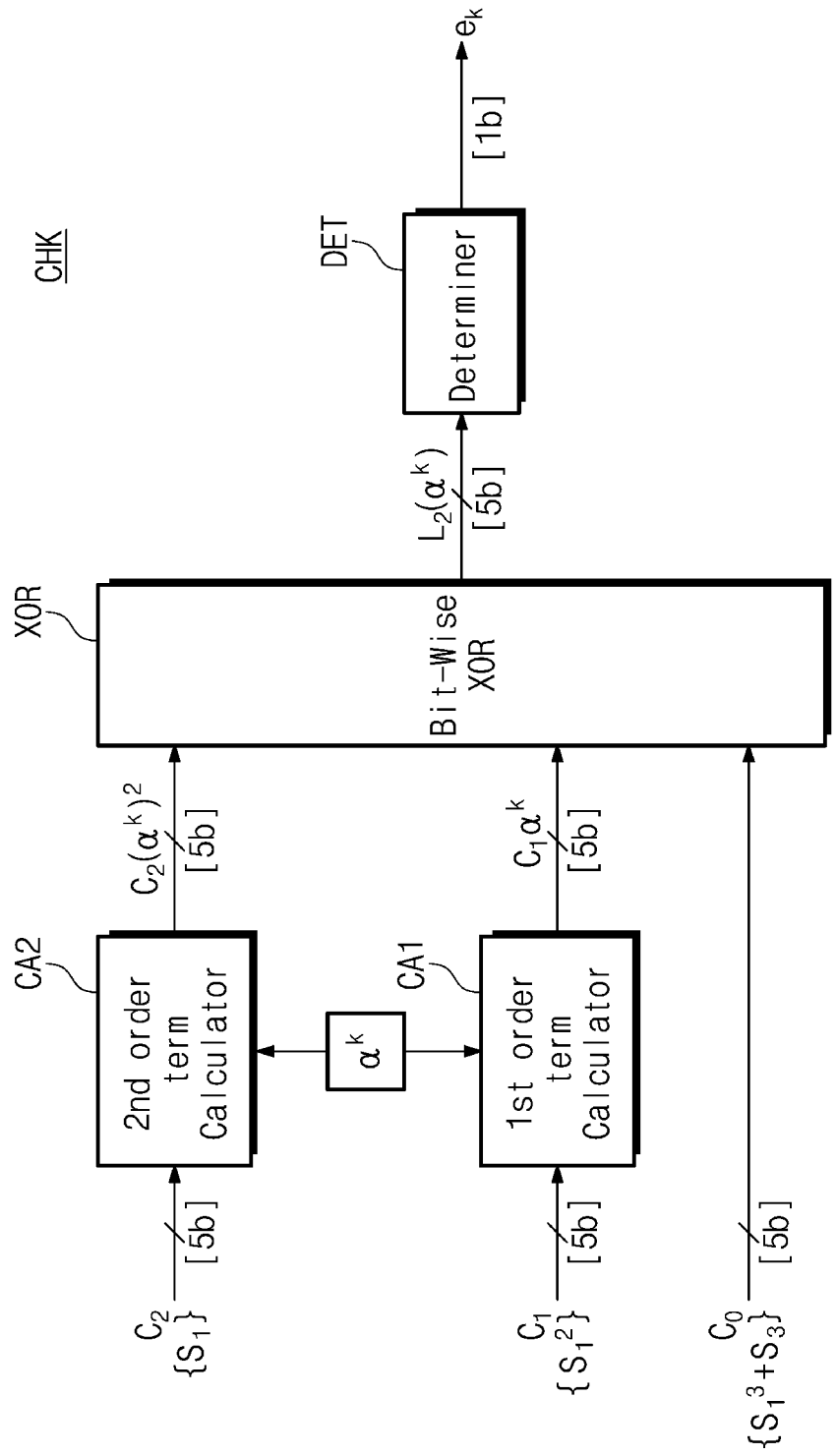
FIGS. 7A to 7C are diagrams showing a configuration of the error vector generator of FIG. 6.
Figure 7B:
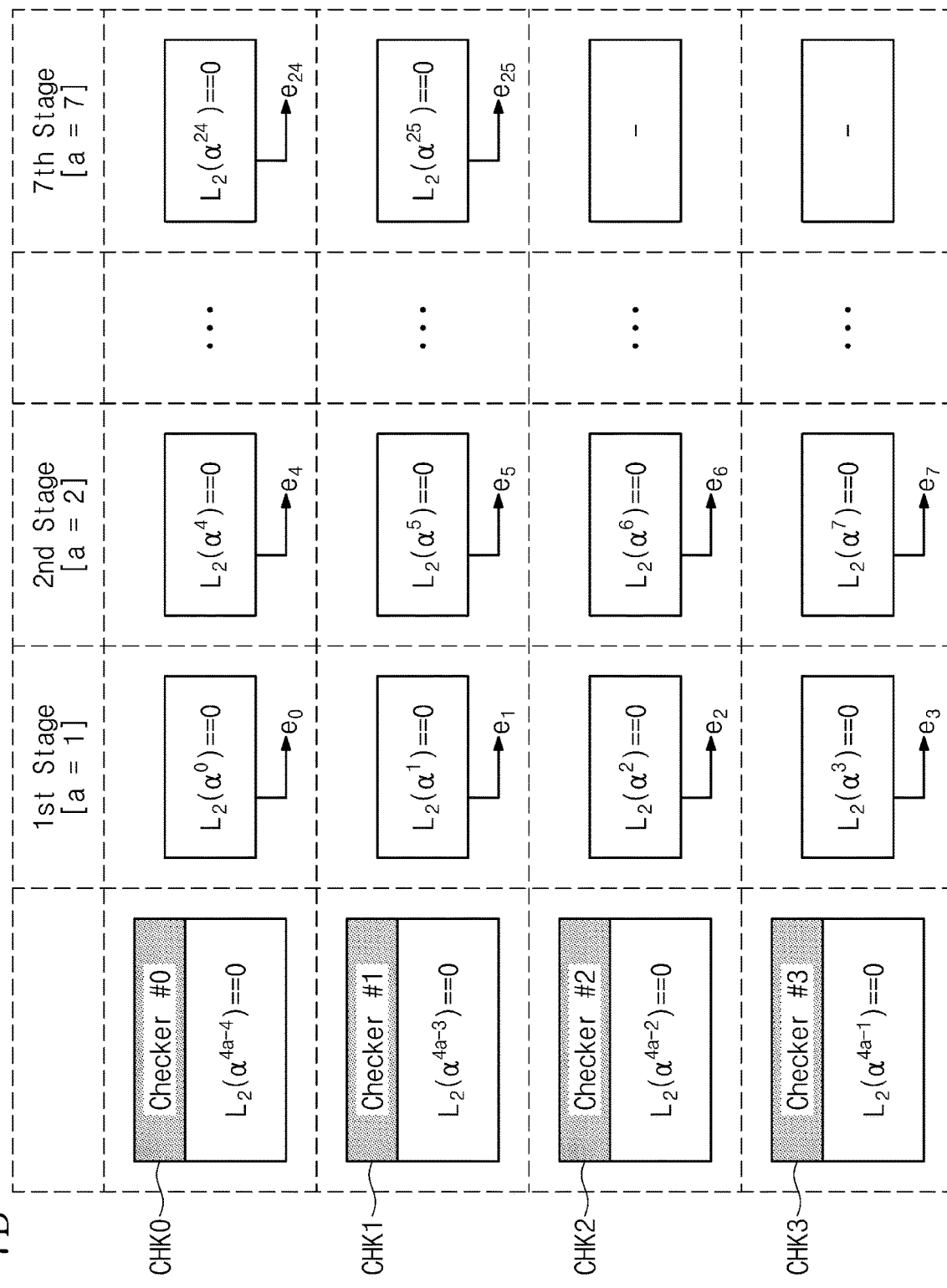
Figure 7C:
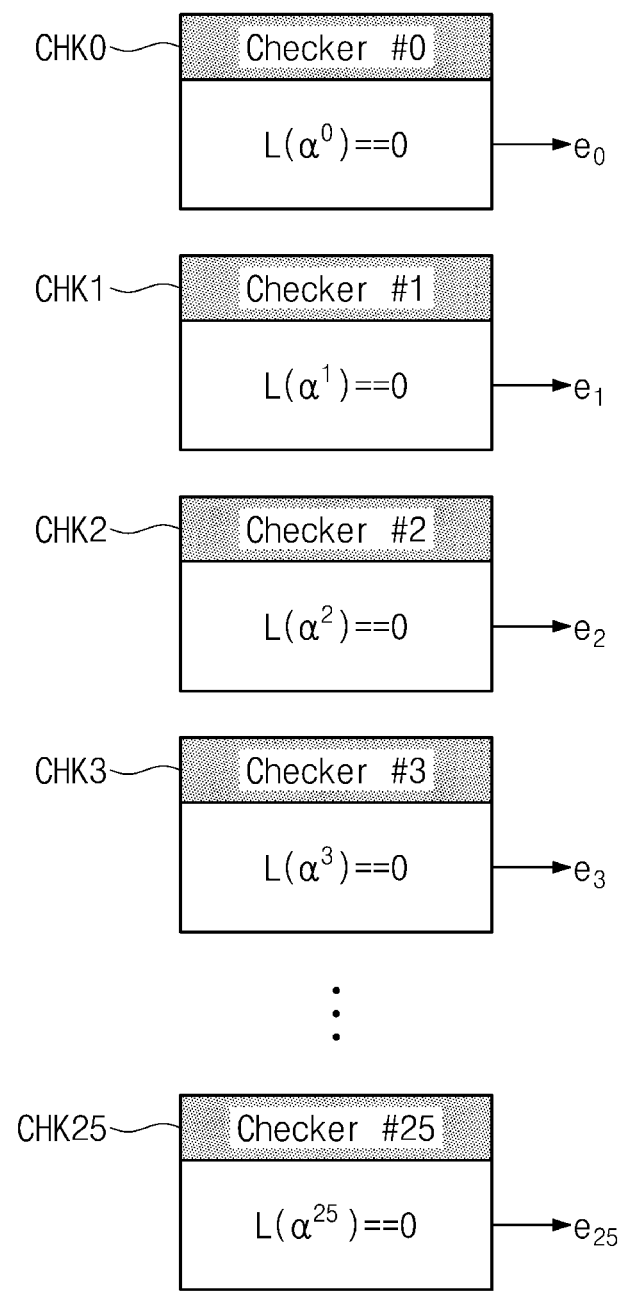

FIG. 6 is a block diagram showing an error location detecting unit of FIG. 4. FIGS. 7A to 7C are diagrams showing a configuration of the error vector generator of FIG. 6. Referring to FIGS. 4 to 7C, the error location detecting unit 112 may include a coefficient calculator 112*a* and an error vector generator 112*b*.

The coefficient calculator 112*a* may receive the syndrome $S_y$ from the syndrome calculating unit 111 and may calculate a plurality of coefficients $C_x$ based on the received syndrome $S_y$. The plurality of coefficients may be variously modified depending on the error correction capability of the ECC circuit 110, a configuration of the H-matrix, an error location polynomial, or the like.

The error vector generator 112*b* may generate the error vector ERV based on the plurality of coefficients $C_x$. For example, the error vector generator 112*b* may include a plurality of checkers. Each of the plurality of checkers may be configured to search for, detect, or calculate a solution of an error location polynomial such as Equation 1.

$$L_2(x)=C_2x^2+C_1x+C_0$$

$$C_2=S_1,$$

$$C_1=S_1^2,$$

$$C_0=S_1^3+S_3 \quad \text{[Equation 1]}$$

Referring to Equation 1, 'x' may denote a field element corresponding to a bit location of a data code; $L_2(x)$ may denote an error location polynomial for determining whether a bit of a location corresponding to the field element of x is an error; $S_1$ may denote a first syndrome corresponding to a product of the data code (i.e., the read data RDT and the parity data PRT) and the upper portion matrix $H_U$ of the H-matrix; and, $S_3$ may denote a third syndrome corresponding to a product of a data code (i.e., the read data RDT and the parity data PRT) and the lower portion matrix $H_L$ of the H-matrix. In an embodiment, 'x' may be a field element (one of $\alpha^0$ to $\alpha^{31}$) defined by the H-matrix H-MAT.

In an embodiment, a bit corresponding to the field element 'x' satisfying "$L_2(x)=0$" may be an error bit in the data code. That is, the error vector ERV indicating the error location of the data code may be generated by searching for, detecting, or calculating the field element 'x' (or the solution of an error location polynomial) satisfying "$L_2(x)=0$". In an embodiment, there may be up to two field elements satisfying "$L_2(x)=0$". That is, the error location polynomial of $L_2(x)$ may be used to detect two error bit locations.

In more detail, as shown in FIG. 7A, a checker CHK may be configured to calculate whether the k-th field element $\alpha^k$ is a solution of the error location polynomial. For example, the checker CHK may include a 1st order term calculator CA1, a 2nd order term calculator CA2, a bit-wise XOR logic XOR, and a determiner circuit DET. Herein, the determiner circuit DET may be referred to as a determine DET. The 1st order term calculator CA1 may be configured to receive a first coefficient $C_1$ from the coefficient calculator 112a and to calculate a 1st order term $C_1\alpha^k$ for the k-th field element $\alpha^k$. In an embodiment, the first coefficient $C_1$ may indicate $S_1^2$ (i.e., the square of the first syndrome $S_1$). In an embodiment, each of the first coefficient $C_1$ and the 1st order term $C_1\alpha^k$ may be a 5-bit binary vector.

The 2nd order term calculator CA2 may be configured to receive a second coefficient $C_2$ from the coefficient calculator 112a and to calculate a 2nd order term $C_2(\alpha^k)^2$ for the k-th field element $\alpha^k$. In an embodiment, the second coefficient $C_2$ may indicate $S_1$ (i.e., the first syndrome $S_1$). In an embodiment, each of the second coefficient $C_2$ and the 2nd order term $C_2(\alpha^k)^2$ may be a 5-bit binary vector.

The bit-wise XOR logic XOR may receive the 1st order term $C_1\alpha^k$ for the k-th field element $\alpha^k$ from the 1st order term calculator CA1, the 2nd order term $C_2(\alpha^k)^2$ for the k-th field element $\alpha^k$ from the 2nd order term calculator CA2, and the 0-th coefficient $C_0$ from the coefficient calculator 112a. In an embodiment, the 0-th coefficient $C_0$ may correspond to "$S_1^3+S_3$" (i.e., the sum of the cube of the first syndrome $S_1$ and the third syndrome $S_3$). The 0-th coefficient $C_0$ may be a 5-bit binary vector. The bit-wise XOR logic XOR may perform a bit-wise XOR operation on received signals. The operation result of the bit-wise XOR logic XOR is provided to the determiner DET. In an embodiment, the operation result of the bit-wise XOR logic XOR may be $L_2(\alpha^k)$ and may be a 5-bit binary vector.

The determiner DET may determine whether an operation result $L_2(\alpha^k)$ of the bit-wise XOR logic XOR is all zero. When, the operation result $L_2(\alpha^k)$ of the bit-wise XOR logic XOR is all zero, then that means the k-th field element $\alpha^k$ is a solution of an error location polynomial (i.e., in the data code, the bit of a location corresponding to the k-th field element $\alpha^k$ is an error). In this case, the determiner DET may output a bit value of "$e_k$" as a k-th error vector element $e_k$. In contrast, when the operation result $L_2(\alpha^k)$ of the bit-wise XOR logic XOR is not all zero (i.e., at least one bit is "1"), the k-th field element $\alpha^k$ may not be the solution of the error location polynomial. In this case, the determiner DET may output a bit value of "$e_k$" as a k-th error vector element $e_k$.

As described above, the checker CHK may search for, detect, determine, or calculate whether the k-th field element $\alpha^k$ is a solution of an error location polynomial. In an embodiment, a data code may include a plurality of bits, and there may be a plurality of field elements respectively corresponding to locations of the plurality of bits. In this case, to search for, detect, determine, or calculate whether each of the plurality of field elements is a solution of an error location polynomial, the error vector generator 112b may include a plurality of checkers.

In an embodiment, the error vector generator 112b may be configured to search for the solution of the error location polynomial described above based on the Chien-search algorithm and to generate the error vector ERV. In an embodiment, the Chien-search algorithm may be performed in a partial parallel method or a full parallel method.

For example, it is assumed that 2-bit error correction for data of 16 bits is performed. In this case, because the data code is a total of 26 bits (data of 16 bits and parity of 10 bits), 26 columns are selected from the H-matrix H-MAT of FIG. 5B. In this case, the selected 26 columns have full-rank characteristics. The 26 field elements may be determined by the selected 26 columns, and the 26 field elements may correspond to locations of bits included in the data code, respectively. For convenience of description, it is assumed that the 26 field elements are $\alpha^0$ to $\alpha^{25}$.

As shown in FIG. 7B, the error vector generator 112b may include four checkers CHK0 to CHK3. The four checkers CHK0 to CHK3 may be configured to search for or calculate a solution that satisfies the error location polynomial among the 26 field elements $\alpha^0$ to $\alpha^{25}$. In this case, because there are the 26 field elements $\alpha^0$ to $\alpha^{25}$ and the four checkers CHK0 to CHK3, the error vector generator 112b may perform an operation on the 26 field elements $\alpha^0$ to $\alpha^{25}$ seven times in units of four.

In more detail, in a first stage (a=1), the 0-th checker CHK0 may determine whether the 0-th field element $\alpha^0$ is an error location polynomial solution (i.e., $L_2(\alpha^0)==0$) and may output a 0-th error vector element $e_0$ based on the determination result. Likewise, in the first stage (a=1), the first to third checkers CHK1 to CHK3 may respectively determine whether the first to third field elements $\alpha^1$ to $\alpha^3$ are solutions of the error location polynomial (i.e., $L_2(\alpha^1)==0$, $L_2(\alpha^2)==0$, and $L_2(\alpha^3)==0$) and may respectively output first to third error vector elements $e_1$ to $e_3$ based on the determination result.

After the first stage (a=1) is completed, in a second stage (a=2), the 0-th to third checkers CHK0 to CHK3 may respectively determine whether the fourth to seventh field elements $\alpha^4$ to $\alpha^7$ are solutions of the error location polynomial (i.e., $L_2(\alpha^4)==0$, $L_2(\alpha^5)==0$, $L_2(\alpha^6)==0$, and $L_2(\alpha^7)==0$), and may respectively output fourth to seventh error vector elements $e_4$ to $e_7$ based on the determination result. Likewise, in a seventh stage (a=7), the 0-th and first checkers CHK0 and CHK1 may respectively determine whether the 24th and 25th field elements $\alpha^{24}$ and $\alpha^{25}$ are solutions of the error location polynomial (i.e., $L_2(\alpha^{24})==0$ and $L_2(\alpha^{25})==0$) and may respectively output 24th and 25th error vector elements $e_{24}$ and $e_{25}$ based on the determination result. The plurality of checkers CHK0 to CHK3 may output the error vector elements $e_0$ to $e_{25}$ by repeating the above-mentioned operation seven times during the first to seventh stages ("a=1" to "a=7"). A combination of the 0-th to 25th error vector elements $e_0$ to $e_{25}$ may be output as the error vector ERV.

As shown in FIG. 7C, the error vector generator 112b may include 26 checkers CHK0 to CHK25. The 26 checkers CHK0 to CHK25 may determine whether each of the 26 field elements $\alpha^0$ to $\alpha^{25}$ is a solution of an error location polynomial. In this case, because the number of checkers CHK0 to CHK25 is the same as the number of field elements $\alpha^0$ to $\alpha^{25}$, the error vector elements $e_0$ to $e_{25}$ (or the error vector ERV) may be generated through a one-time operation (or one stage).

As described above, an embodiment of FIG. 7B is a configuration based on a Chien-search algorithm in a partial parallel method, and an embodiment of FIG. 7C is a configuration based on a Chien-search algorithm in a full parallel method. In this case, in the Chien-search algorithm in the partial parallel method, because the error vector generator 112b includes checkers, of which the number is smaller than the number of bits of data code, the error vector generator 112b may have a relatively simple structure. However, because a process of searching for or calculating the solution of an error location polynomial is repeated, a calculation time may increase. On the other hand, in the Chien-search algorithm in the full parallel method, because the error vector generator 112b includes checkers, of which the number is the same as the number of bits of data code, the error vector generator 112b may quickly generate an error vector. However, as the number of checkers increases, the structure may become complex.

Figure 8:
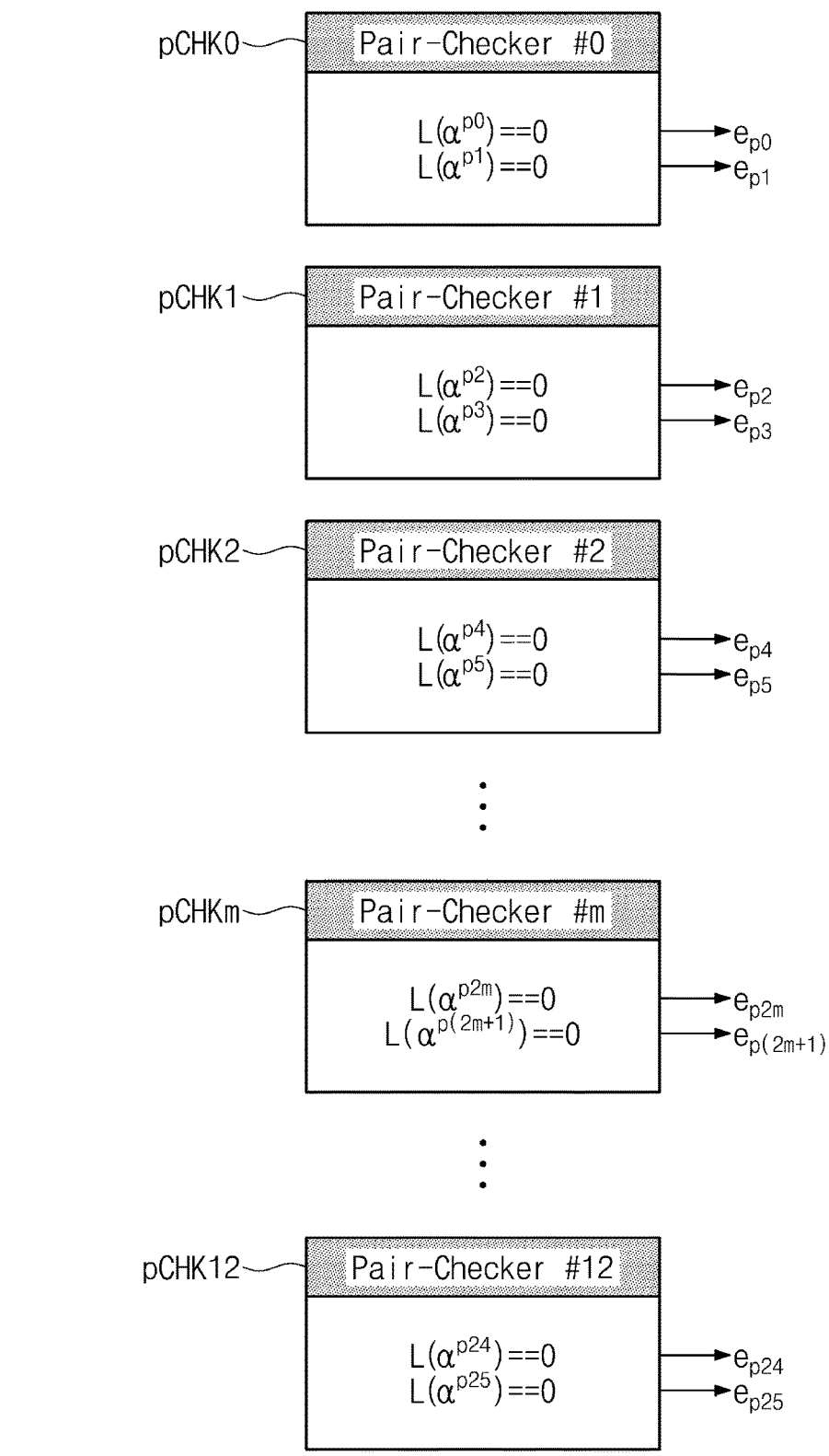
FIG. 8 is a block diagram showing a structure of an error vector generator of FIG. 6.

FIG. 8 is a block diagram showing a structure of an error vector generator of FIG. 6. Hereinafter, for convenience of description, a reference symbol of "$\alpha^{pX}$" is used. This is provided to describe a pair configuration of field elements according to an embodiment of the present disclosure. The index number or order indicated by "$\alpha^{pX}$" may not match the index number or order of the Galois field GF($2^5$) or the field element of the H-matrix H-MAT. For example, field elements of "$\alpha^{p0}$" and "$\alpha^{p1}$" may be field elements included in a pair calculated by the 0-th pair checker pCHK0 according to an embodiment of the present disclosure. Each of field elements of "$\alpha^{p0}$" and "$\alpha^{p1}$" may be one of the field elements $\alpha^0$ to $\alpha^{30}$ of the H-matrix H-MAT described above. In this case, the field elements of "$\alpha^{p0}$" and "$\alpha^{p1}$" may be an adjacent field element among the field elements $\alpha^0$ to $\alpha^{30}$ of the H-matrix H-MAT, but may not be adjacent to each other. That is, it will be understood that the field elements of "$\alpha^{p0}$" and "$\alpha^{p1}$" may be variously modified depending on a design method of the present disclosure. However, the field elements of "$\alpha^{p0}$" and "$\alpha^{p1}$" may have a specific condition or a specific rule, which will be described in more detail below.

Referring to FIGS. 6 and 8, the error vector generator 112b may be configured to generate the error vector ERV by searching for, or calculating, a solution of an error location polynomial. The error vector generator 112b may include a plurality of multi-checkers pCHK0 to pCHK12. Each of the plurality of multi-checkers pCHK0 to pCHK12 may be configured to output at least two error vector elements by performing an error location operation on at least two field elements. In an embodiment, an error location operation may indicate an operation of calculating whether a condition of "$L_2(x)=0$" is satisfied or an operation of calculating the solution of the error location polynomial, by substituting a field element into the error location polynomial described with reference to Equation 1.

For example, the 0-th pair checker pCHK0 may perform an error location operation on the p0-th field element $\alpha^{p0}$ and the p1-st field element $\alpha^{p1}$ and may output a p0-th error vector element $e_{p0}$ and a p1-st error vector element $e_{p1}$ based on the operation result, respectively. The first pair checker pCHK1 may perform an error location operation for a p2-nd field element $\alpha^{p2}$ and a p3-th field element $\alpha^{p3}$, and may output a p2-nd error vector element $e_{p2}$ and a p3-th error vector element $e_{p3}$ based on the operation result, respectively. The second pair checker pCHK2 may perform an error location operation for a p4-th field element $\alpha^{p4}$ and a fifth field element $\alpha^{p5}$ and may output a p4-th error vector element $e_{p4}$ and a p5-th error vector element $e_{p5}$ based on the operation result, respectively. The m-th pair checker pCHKm may perform an error location operation for a p2m-th field element $\alpha^{p2m}$ and a (p(2m+1))-th field element $\alpha^{p(2m+1)}$ and may output a p2m-th error vector element $e_{p2m}$ and a (p(2m+1))-th error vector element $e_{p(2m+1)}$ based on the operation result, respectively. Likewise, the twelfth pair checker pCHK12 may perform an error location operation for a p24th field element $\alpha^{p24}$ and a 25th field element $\alpha^{p25}$ and may output a p24-th error vector element $e_{p24}$ and a p25-th error vector element $e_{p25}$ based on the operation result, respectively.

As described above, each of the plurality of pair checkers pCHK0 to pCHK12 may be configured to perform an error location operation on two field elements and to output two error vector elements. As such, compared to the embodiment of FIG. 7B (i.e., a partial-parallel method), because all error vector elements are calculated and/or generated through one stage, an error vector generation time may be shortened. Moreover, compared to embodiment of FIG. 7C (i.e., a full parallel method), because the number of checkers is reduced by half, a structure of the ECC circuit 110 may be simplified. That is, according to embodiments of the present disclosure, a duration of an error calculation operation may be shortened and, at the same time, the structure of the ECC circuit 110 may be simplified.

In an embodiment, two field elements (e.g., $\alpha^{p2m}$ and $\alpha^{p(2m+1)}$) calculated by one pair checker (e.g., pCHK0) are referred to as a "pair". In this case, the pair may be composed of at least two field elements. Pairs used by each of the plurality of pair checkers pCHK0 to pCHK12 include different field elements. That is, each of the field elements operated by each of the plurality of pair checkers pCHK0 to pCHK12 may be an independent binary vector. Each of field elements included in each of pairs operated by each of the plurality of pair checkers pCHK0 to pCHK12 corresponds to one of columns included in the H-matrix and does not overlap each other. Field elements included in each of the pairs may be designed to satisfy a predetermined rule.

For example, the m-th pair operated by the m-th pair checker pCHKm may include the p2m-th field element $\alpha^{p2m}$ and the (p(2m+1))-th field element $\alpha^{p(2m+1)}$. In this case, the p2m-th field element $\alpha^{p2m}$ and the (p(2m+1))-th field element $\alpha^{p(2m+1)}$ may satisfy the relationship of Equation 2.

$$\alpha^{p(2m+1)} = \alpha^{p2m} + \alpha^j \qquad \text{[Equation 2]}$$

Referring to Equation 2, $\alpha^j$ may indicate one of field elements of the Galois field GF($2^5$) described with reference to FIG. 5A. That is, field elements operated by one pair checker may be designed to satisfy a specific rule or specific condition as described above. In this case, an error location polynomial, to which the field elements $\alpha^{p2m}$ and $\alpha^{p(2m+1)}$ included in the m-th pair are reflected, may be expressed as in Equation 3.

$$L_2(\alpha^{p(2m)}) = S_1(\alpha^{p(2m)})^2 + S_1^2 \alpha^{2m} + S_1^3 + S_3$$

$$L_2(\alpha^{p(2m+1)}) = L_2(\alpha^{p2m} + \alpha^j) = S_1(\alpha^{p2m} + \alpha^j)^2 + S_1^2 (\alpha^{p2m} + \alpha^j) + S_1^3 + S_3 \qquad \text{[Equation 3]}$$

Variables of Equation 3 are described above, and thus a detailed description thereof will be omitted to avoid redundancy. For ease of explanation of an embodiment of the present disclosure, it is assumed that $\alpha^j$ is $\alpha^0$ (i.e., 1). In this case, the error location polynomial of $L_2(\alpha^{p(2m+1)})$ may be expressed as in Equation 4.

$$\begin{aligned} L_2\bigl(\alpha^{p(2m+1)}\bigr) &= L_2\bigl(\alpha^{p2m} + 1\bigr) \qquad \text{[Equation 4]} \\ &= S_1\bigl(\alpha^{p2m} + 1\bigr)^2 + S_1^2\bigl(\alpha^{p2m} + 1\bigr) + S_1^3 + S_3 \\ &= S_1\bigl((\alpha^{p2m})^2 + 1\bigr) + S_1^2\bigl(\alpha^{p2m} + 1\bigr) + S_1^3 + S_3, \\ &\quad (\text{note that } 2\alpha^{p2m} = 0) \end{aligned}$$

Variables of Equation 4 are described above, and thus a detailed description thereof will be omitted to avoid redundancy. As expressed in Equation 4, the error location polynomial of $L_2(\alpha^{p(2m+1)})$ may be expressed as a polynomial for $\alpha^{p2m}$. In this case, $L_2(\alpha^{p(2m+1)})$ may be expressed as in Equation 5.

$$\begin{aligned} L_2\bigl(\alpha^{p(2m+1)}\bigr) &= L_2\bigl(\alpha^{p2m} + 1\bigr) \qquad \text{[Equation 5]} \\ &= S_1\bigl(\alpha^{p2m}\bigr)^2 + S_1^2 \alpha^{p2m} + S_1^3 + S_3 + S_1 + S_1^2 \\ &= L_2\bigl(\alpha^{p2m}\bigr) + S_1 + S_1^2 \end{aligned}$$

Variables of Equation 5 are described above, and thus a detailed description thereof will be omitted to avoid redundancy. As described above, when the field elements $\alpha^{p2m}$ and $\alpha^{p(2m+1)}$ included in the m-th pair satisfy a condition described in Equation 2, as expressed in Equation 5, the error location polynomial $L_2(\alpha^{p(2m+1)})$ for the (p(2m+1))-th field element $\alpha^{p(2m+1)}$ may be expressed as the error location polynomial $L_2(\alpha^{p2m})$ for the p2m-th field element $\alpha^{p2m}$ and a common coefficient $(S_1+S_1^2)$. In this case, because a separate decoding design for the error location polynomial $L_2(\alpha^{p(2m+1)})$ for the (p(2m+1))-th field element $\alpha^{p(2m+1)}$ is not required, the structure of the ECC circuit 110 may be simplified.

In an embodiment, pairs of field elements operated by the plurality of pair checkers pCHK0 to pCHK12 may be designed to each satisfy the same rule (e.g., a rule according to Equation 2). In this case, a common coefficient (e.g., a common coefficient $(S_1+S_1^2)$ in Equation 5) used by each of the plurality of pair checkers pCHK0 to pCHK12 is the same, and thus the design structure for a coefficient operation may be simplified. As described above, pairs of field elements operated by the plurality of pair checkers pCHK0 to pCHK12 may be designed based on the same rules as each other, but the scope of the present disclosure is not limited thereto. For example, pairs of field elements operated by the plurality of pair checkers pCHK0 to pCHK12 may be designed based on different rules from one another. In more detail, some (e.g., pCHK0 to pCHK5) of the plurality of pair checkers pCHK0 to pCHK12 may use pairs that satisfy a first condition (or a first rule), and the others (e.g., pCHK6 to pCHK12) of the plurality of pair checkers pCHK0 to pCHK12 may use pairs that satisfy a second condition (or a second rule). In this case, pair checkers that use pairs satisfying the same condition (or the same rule) may use the same common coefficient. That is, some pair checkers (e.g., pCHK0 to pCHK5) that use pairs satisfying the first condition (or the first rule) may use the first common coefficient in common, and other pair checkers (e.g., pCHK6 to pCHK12) that use pairs satisfying the second condition (or the second rule) may use the second common coefficient in common.

Figure 9:
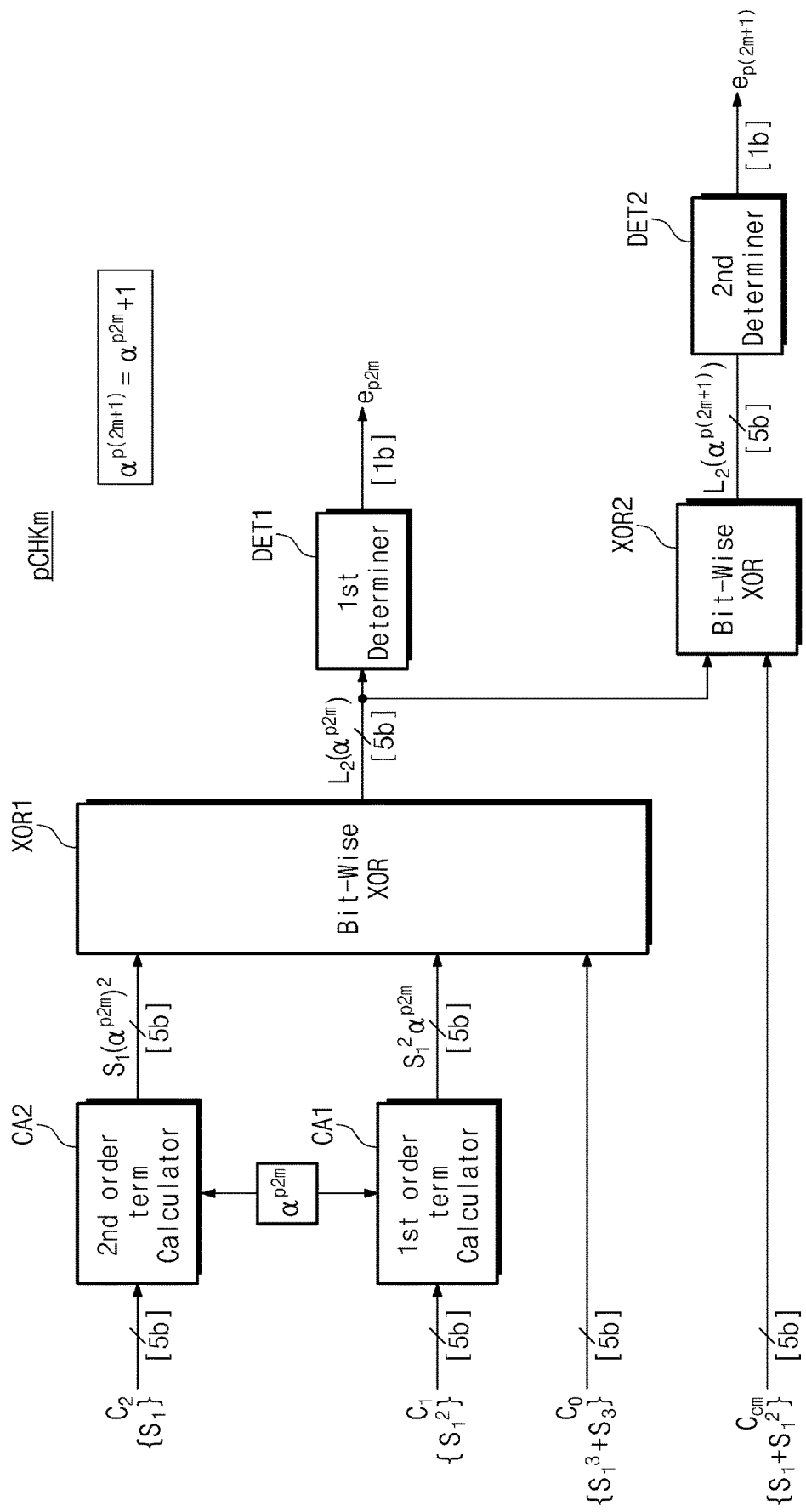
FIG. 9 is a block diagram showing a pair checker of FIG. 8.

FIG. 9 is a block diagram showing a pair checker of FIG. 8. For convenience of description, a schematic structure of the m-th pair checker pCHKm is described with reference to FIG. 8. In this case, it is assumed that the m-th pair checker pCHKm may perform an error location operation on each of the p2m-th field element $\alpha^{p2m}$ and the (p(2m+1))-th field element $\alpha^{p(2m+1)}$, and the p2m-th field element $\alpha^{p2m}$ and the (p(2m+1))-th field element $\alpha^{p(2m+1)}$ satisfy a rule (i.e., $\alpha^{p2m+1}=\alpha^{p2m}+1$) according to Equation 4.

Referring to FIGS. 6, 8, and 9, the m-th pair checker pCHKm may include the 1st order term calculator CA1, the 2nd order term calculator CA2, a first bit-wise XOR logic XOR1, a first determiner DET1, a second bit-wise XOR logic XOR2, and a second determiner DET2.

The 1st order term calculator CA1 may receive the first coefficient $C_1$ from the coefficient calculator 112a. In an embodiment, the first coefficient $C_1$ may be $S_1^3$, but the scope of the present disclosure is not limited thereto. The 1st order term calculator CA1 may output a 1st order term $S_1^2\alpha^{p2m}$ based on the first coefficient $C_1$ and the p2m-th field element $\alpha^{p2m}$. Each of the first coefficient $C_1$, the p2m-th field element $\alpha^{p2m}$, and the 1st order term $S_1^2\alpha^{p2m}$ may be a 5-bit binary vector.

The 2nd order term calculator CA2 may receive the second coefficient $C_2$ from the coefficient calculator 112a. The second coefficient $C_2$ may be $S_1$, but the scope of the present disclosure is not limited thereto. The 2nd order term calculator CA2 may output the 2nd order term $S_1(\alpha^{p2m})^2$ based on the second coefficient $C_2$ and the p2m-th field element $\alpha^{p2m}$. Each of the second coefficient $C_2$, the p2m-th field element $\alpha^{p2m}$, and the 2nd order term $S_1(\alpha^{p2m})^2$ may be a 5-bit binary vector.

The first bit-wise XOR logic XOR1 may receive the 1st order term $S_1^2\alpha^{p2m}$ from the 1st order term calculator CA1, may receive the 2nd order term $S_1(\alpha^{p2m})^2$ from the 2nd order term calculator CA2, and may receive the 0-th coefficient $C_0$ from the coefficient calculator 112a. In an embodiment, the 0-th coefficient $C_0$ may be "$S_1^3+S_3$", but the scope of the present disclosure is not limited thereto. The first bit-wise XOR logic XOR1 may perform a bit-wise XOR operation on the received signals. The operation result (i.e., $L_2(\alpha^{p2m})$) of the first bit-wise XOR logic XOR1 is provided to the first determiner DET1. The 0-th coefficient $C_0$ and the operation result (i.e., $L_2(\alpha^{p2m})$) may be a 5-bit binary vector.

The first determiner DET1 may determine whether an operation result (i.e., $L_2(\alpha^{p2m})$) of the first bit-wise XOR logic XOR1 is all zero, and may output a p2m-th error vector element $e_{p2m}$ based on the determination result. Because an operation of the first determiner DET1 is similar to that of the determiner DET described with reference to FIG. 7A, a detailed description thereof will be omitted to avoid redundancy.

The second bit-wise XOR logic XOR2 may receive an operation result (i.e., $L_2(\alpha^{p2m})$) from the first bit-wise XOR logic XOR1 and may receive a common coefficient $C_{cm}$ from the coefficient calculator 112a. In an embodiment, as described with reference to Equation 5, the common coefficient $C_{cm}$ may be "$S_1+S_1^2$", but the scope of the present disclosure is not limited thereto. The second bit-wise XOR logic XOR2 may perform a bit-wise XOR operation on the received signals. The operation result of the second bit-wise XOR logic XOR2 may be "$L_2(\alpha^{p2m})+S_1+S_1^2$". In this case, as described with reference to Equation 5, "$L_2(\alpha^{p2m})+S_1+S_1^2$" is the same as $L_2(\alpha^{p(2m+1)})$. That is, the operation result of the second bit-wise XOR logic XOR2 may be "$L_2(\alpha^{p(2m+1)})$".

The second determiner DET2 may receive the operation result $L_2(\alpha^{p(2m+1)})$ of the second bit-wise XOR logic XOR2 and may determine whether the received signal is all zero. The second determiner DET2 may output a (p(2m+1))-th error vector element $e_{p(2m+1)}$ based on the determination result.

As described above, one pair checker (e.g., the m-th pair checker pCHKm) may perform an error location operation on at least two field elements designed to satisfy a predetermined rule. In this case, a circuit structure for performing an error location operation may be simplified. For example, in a case of the checker CHK described with reference to FIG. 7A, because the error location operation is performed on one field element, two checkers CHK, each of which is described with reference to FIG. 7A, are required to perform the error location operation on two field elements. In this case, there is a need for two 1st order term calculators, two 2nd order term calculators, two bit-wise XOR logics, and two determiners. On the other hand, the pair checker pCHKm of FIG. 9 may perform an error location operation on two field elements, and includes one 1st order term calculator, one 2nd order term calculator, one bit-wise XOR logics, and two determiners. That is, the pair checker pCHKm of FIG. 9 may provide the same calculation performance by using calculators or logics, of which the number is reduced compared to the checker CHK of FIG. 7A.

FIG. 10 is a diagram for describing field elements respectively operated by a plurality of pair checkers of FIG. 8. Referring to FIGS. 8 and 10, the 0-th to twelfth pair checkers pCHK0 to pCHK12 may perform error location operations on 0-th to twelfth pairs, respectively. In this case, field elements included in each of the 0-th to twelfth pairs may be designed as shown in FIG. 10.

For example, it is assumed that the m-th pair used in the m-th pair checker pCHKm includes $\alpha^{p2m}$ and $\alpha^{p(2m+1)}$, and satisfies "$\alpha^{p(2m+1)}=\alpha^{p2m}+1$". In this case, the 0-th pair may include the first and eighteenth field elements $\alpha^1$ and $\alpha^{18}$; the first pair may include the second and fifth field elements $\alpha^2$ and $\alpha^5$; the second pair may include the third and 29th field elements $\alpha^3$ and $\alpha^{29}$; the third pair may include the fourth and tenth field elements $\alpha^4$ and $\alpha^{10}$; the fourth pair may include the sixth and 27th field elements $\alpha^6$ and $\alpha^{27}$; the fifth pair may include the seventh and 22nd field elements $\alpha^7$ and $\alpha^{22}$; the sixth pair may include the eighth and twentieth field elements $\alpha^8$ and $\alpha^{20}$; the seventh pair may include the ninth and sixteenth field elements $\alpha^9$ and $\alpha^{16}$; the eighth pair may include the eleventh and nineteenth field elements $\alpha^{11}$ and $\alpha^{19}$; the ninth pair may include the twelfth and 23rd field elements $\neq^{12}$ and $\alpha^{23}$; the tenth pair may include thirteenth and fourteenth field elements $\alpha^{13}$ and $\alpha^{14}$; the eleventh pair may include the fifteenth and 24th field elements $\alpha^{15}$ and $\alpha^{24}$; and the twelfth pair may include seventeenth and 30th field elements $\alpha^{17}$ and $\alpha^{30}$. The field elements included in the above-mentioned pairs are simple examples, and the field elements included in each of the pairs may be variously modified according to a rule between field elements, which are included in each of the pairs, and a design method of the H-matrix.

Figure 11:
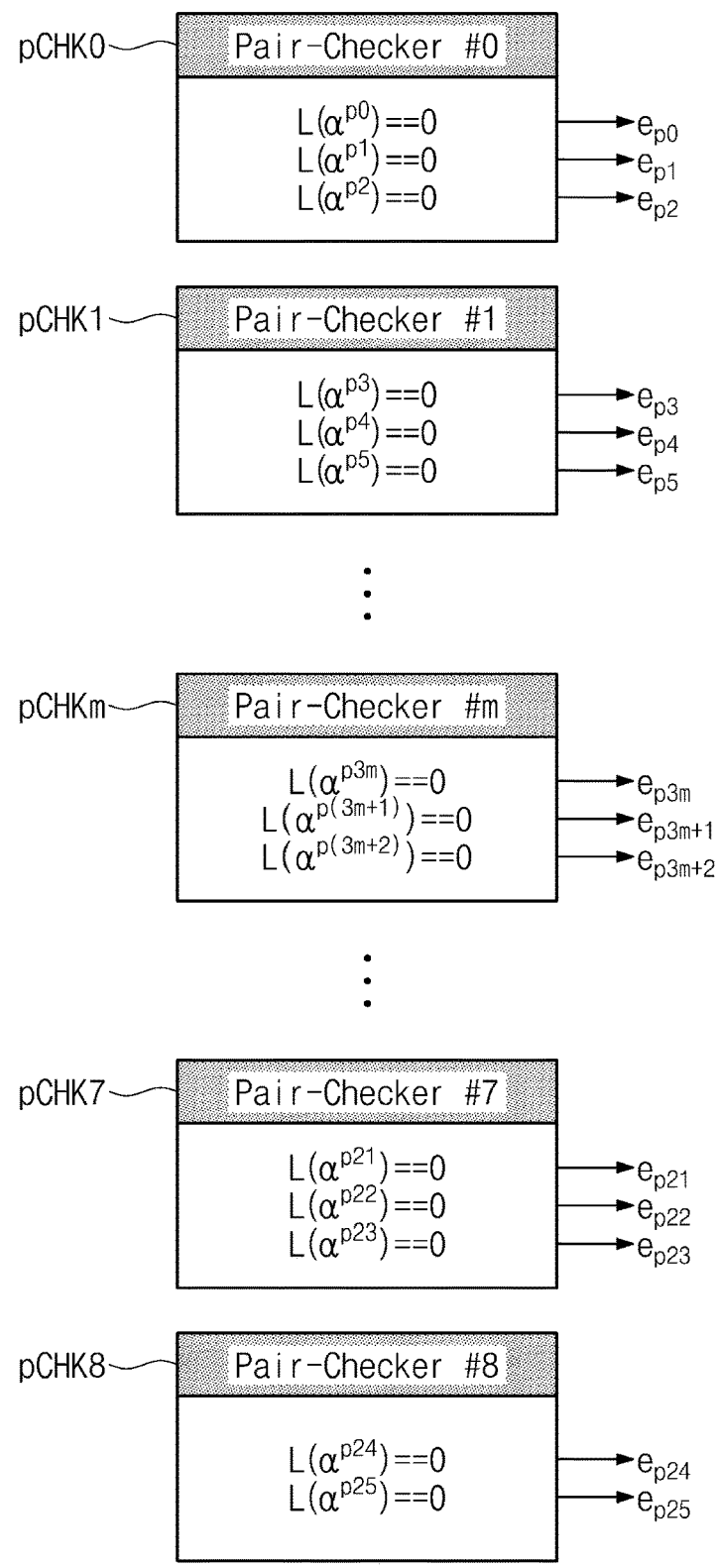
FIG. 11 is a block diagram showing an error location detecting unit of FIG. 6.

FIG. 11 is a block diagram showing an error location detecting unit of FIG. 6. For convenience of description, detailed descriptions associated with the components described above will be omitted to avoid redundancy. Referring to FIGS. 6 and 11, the error location detecting unit 112 may include the plurality of pair checkers pCHK0 to pCHK8. Each of the plurality of pair checkers pCHK0 to pCHK8 may be configured to output at least two error vector elements by performing an error location operation on at least two field elements. In an embodiment, in the embodiments described with reference to FIGS. 8 to 10, one pair checker may perform an error location operation on two field elements. That is, in the embodiment described with reference to FIGS. 8 to 10, one pair is composed of two field elements. On the other hand, in an embodiment of FIG. 11, one pair checker may perform an error location operation on three field elements.

For example, in the embodiment of FIG. 11, the 0-th pair checker pCHK0 may output the p0-th error vector element $e_{p0}$, the p1-st error vector element $e_{p1}$, and the p2-nd error vector element $e_{p2}$ by performing an error location operation on the p0-th field element $\alpha^{p0}$, the p1-st field element $\alpha^{p1}$, and the p2-nd field element $\alpha^{p2}$; the first pair checker pCHK1 may output the p3-th error vector element $e_{p3}$, the p4-th error vector element $e_{p4}$, and the p5-th error vector element $e_{p5}$ by performing an error location operation on the p3-th field element $\alpha^{p3}$, the p4-th field element $\alpha^{p4}$, and the p5-th field element $\alpha^{p5}$; the m-th pair checker pCHKm may output the p3m-th error vector element $e_{p3m}$, the (p(3m+1))-th error vector element $e_{p(3m+1)}$, and the (p(3m+2)-th error vector element $e_{p(3m+2)}$ by performing an error location operation on the p3m-th field element $\alpha^{p3m}$, the (p(3m+1))-th field element $\alpha^{p(3m+1)}$, and the (p(3m+2))-th field element $\alpha^{p(3m+2)}$; the seventh pair checker pCHK7 may output the p21-st error vector element $e_{p21}$, the p22-nd error vector element $e_{p22}$, and the p23-th error vector element $e_{p23}$ by performing an error location operation on the p21-st field element $\alpha^{p21}$, the p22-nd field element $\alpha^{p22}$, and the p23-th field element $\alpha^{p23}$; and, the eighth pair checker pCHK8 may output the p24-th error vector element $e_{p24}$ and the p25-th error vector element $e_{p25}$ by performing an error location operation on the p24-th field element $\alpha^{p24}$ and the p25-th field element $\alpha^{p25}$.

In an embodiment, as in the above description, a pair of three field elements operated by one pair checker may be designed to have a specific rule. For example, the three field elements calculated by the m-th pair checker pCHKm may be $\alpha^{p3m}$, $\alpha^{p(3m+1)}$, and $\alpha^{p(3m+2)}$. In this case, the three field elements $\alpha^{p3m}$, $\alpha^{p(3m+1)}$, and $\alpha^{p(3m+2)}$ may be designed to have a rule such as Equation 6.

$$\alpha^{p(3m+1)}=\alpha^{p3m}+\alpha^k$$

$$\alpha^{p(3m+2)}=\alpha^{p3m}+\alpha_j \qquad \text{[Equation 6]}$$

Referring to Equation 6, because $\alpha^k$ may be one of a plurality of field elements included in the Galois field $GF(2^5)$ of FIG. 5A, and the other variables are similar to those described above, a detailed description thereof is omitted to avoid redundancy. According to Equation 6, when the three field elements $\alpha^{p3m}$, $\alpha^{p(3m+1)}$, and $\alpha^{p(3m+2)}$ are designed, the result of the error location operation on the three field elements $\alpha^{p3m}$, $\alpha^{p(3m+1)}$, and $\alpha^{p(3m+2)}$ may be as shown in Equation 7. In this case, for convenience of description, it is assumed that 'k' is 0 and 'j' is 1.

$$\begin{aligned}
L_2(\alpha^{p(3m)}) &= S_1(\alpha^{p(3m)})^2 + S_1^2\alpha^{3m} + S_1^3 + S_3 \qquad \text{[Equation 7]}\\
L_2(\alpha^{p(3m+1)}) &= L_2(\alpha^{p3m} + 1)\\
&= S_1(\alpha^{p(3m)})^2 + S_1^2\alpha^{3m} + S_1^3 + S_3 + S_1 + S_1^2\\
L_2(\alpha^{p(3m+1)}) &= L_2(\alpha^{p3m} + \alpha^1)\\
&= S_1(\alpha^{p(3m)})^2 + S_1^2\alpha^{3m} + S_1^3 + S_3 + S_1\alpha^1 + S_1^2\alpha^1
\end{aligned}$$

Variables of Equation 7 are similar to those described above, and thus a detailed description thereof is omitted to avoid redundancy. As described in Equation 7, a result (i.e., $L_2(\alpha^{p(3m+1)})$) of an error location operation on $\alpha^{p(3m+1)}$ may be expressed as the sum of a result (i.e., $L_2(\alpha^{p3m})$) of an error location operation on $\alpha^{p3m}$ and the first common coefficient $(S_1+S_1^2)$. A result (i.e., $L_2(\alpha^{p(3m+2)})$) of an error location operation on $\alpha^{p(3m+2)}$ may be expressed as the sum of a result (i.e., $L_2(\alpha^{p3m})$) of the error location operation on $\alpha^{p3m}$ and the second common coefficient $(S_1\alpha+S_1^2\alpha)$. That is, an error location operation on two field elements among the three field elements is performed by using the result of an error location operation on the other field element, and thus a structure of the error location detecting unit 112 may be simplified.

Figure 12:
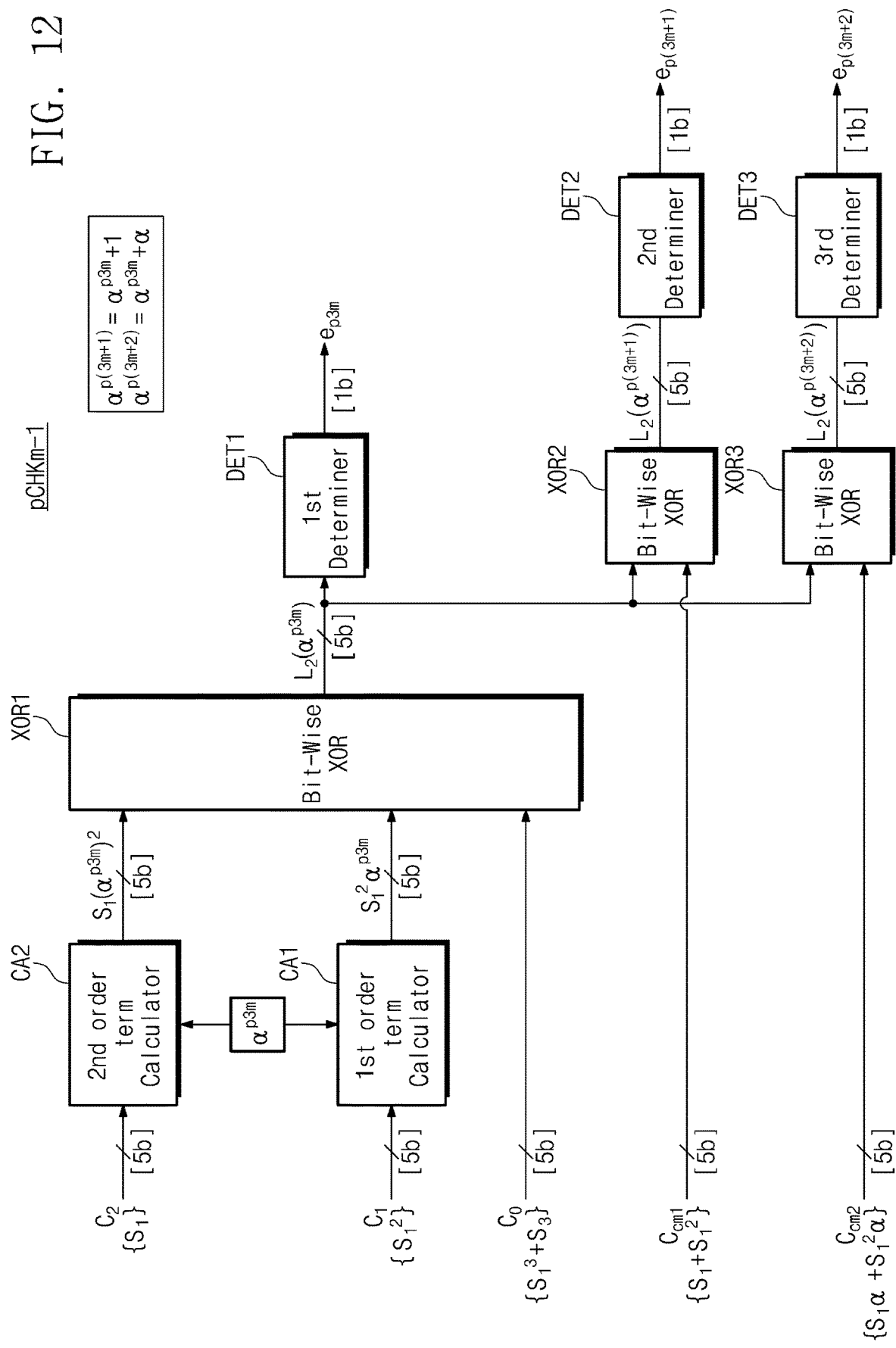
FIG. 12 is a block diagram showing one of a plurality of pair checkers of FIG. 11.

FIG. 12 is a block diagram showing one of a plurality of pair checkers of FIG. 11. For convenience of description, detailed descriptions associated with the components described above will be omitted to avoid redundancy. Referring to FIGS. 11 and 12, a m-th pair checker pCHKm−1 may perform an error location operation on three field elements (e.g., $\alpha^{p3m}$, $\alpha^{p(3m+1)}$, and $\alpha^{p(3m+2)}$). In this case, the three field elements (e.g., $\alpha^{p3m}$, $\alpha^{p(3m+1)}$, and $\alpha^{p(3m+2)}$) may satisfy a rule (i.e., $\alpha^{p(3m+1)}=\alpha^{p3m}+1$ and $\alpha^{p(3m+2)}=\alpha^{p3m}+\alpha$) described with reference to Equation 7.

The m-th pair checker pCHKm−1 may include the 1st order term calculator CA1, the 2nd order term calculator CA2, the first bit-wise XOR logic XOR1, the first determiner DET1, the second bit-wise XOR logic XOR2, the second determiner DET2, a third bit-wise XOR logic XOR3, and a third determiner DET3. The configurations and operations of the 1st order term calculator CA1, the 2nd order term calculator CA2, the first bit-wise XOR logic XOR1, and the first determiner DET1 are similar to those described with reference to FIGS. 7A and 9, and thus a detailed description thereof is omitted to avoid redundancy.

The second bit-wise XOR logic XOR2 may receive an operation result (i.e., $L_2(\alpha^{p3m})$) from the first bit-wise XOR logic XOR1 and may receive a first common coefficient $C_{cm1}$ from the coefficient calculator 112a. In an embodiment, as described with reference to Equation 7, the first common coefficient $C_{cm1}$ may be "$S_1 + S_1^2$", but the scope of the present disclosure is not limited thereto. The second bit-wise XOR logic XOR2 may perform a bit-wise XOR operation on the received signals. The operation result of the second bit-wise XOR logic XOR2 may be "$L_2(\alpha^{p3m}) + S_1 + S_1^2$". In this case, as described with reference to Equation 7, "$L_2(\alpha^{p3m}) + S_1 + S_1^2$" is the same as $L_2(\alpha^{p(3m+1)})$. That is, the operation result of the second bit-wise XOR logic XOR2 may be "$L_2(\alpha^{p(3m+1)})$".

The second determiner DET2 may receive the operation result $L_2(\alpha^{p(3m+1)})$ of the second bit-wise XOR logic XOR2 and may determine whether the received signal is all zero. The second determiner DET2 may output a (p(3m+1))-th error vector element $e_{p(3m+1)}$ based on the determination result.

The third bit-wise XOR logic XOR3 may receive an operation result (i.e., $L_2(\alpha^{p3m})$) from the first bit-wise XOR logic XOR1 and may receive a second common coefficient $C_{cm2}$ from the coefficient calculator 112a. In an embodiment, as described with reference to Equation 7, the second common coefficient $C_{cm2}$ may be "$S_1\alpha + S_1^2\alpha$", but the scope of the present disclosure is not limited thereto. The third bit-wise XOR logic XOR3 may perform a bit-wise XOR operation on the received signals. The operation result of the third bit-wise XOR logic XOR3 may be "$L_2(\alpha^{p3m}) + S_1\alpha + S_1^2\alpha$". In this case, as described with reference to Equation 7, "$L_2(\alpha^{p3m}) + S_1\alpha + S_1^2\alpha$" is the same as $L_2(\alpha^{p(3m+2)})$. That is, the operation result of the third bit-wise XOR logic XOR3 may be "$L_2(\alpha^{p(3m+2)})$".

The third determiner DET3 may receive the operation result $L_2(\alpha^{p(3m+2)})$ of the third bit-wise XOR logic XOR3 and may determine whether the received signal is all zero. The third determiner DET3 may output a (p(3m+2))-th error vector element $e_{p(3m+2)}$ based on the determination result.

As described above, the ECC circuit 110 according to an embodiment of the present disclosure may include a pair checker capable of performing an error location operation on at least two field elements simultaneously or in parallel. In this case, as described above, the error vector generation time may be shortened and, at the same time, the structure of the ECC circuit 110 may be simplified.

Figure 13:
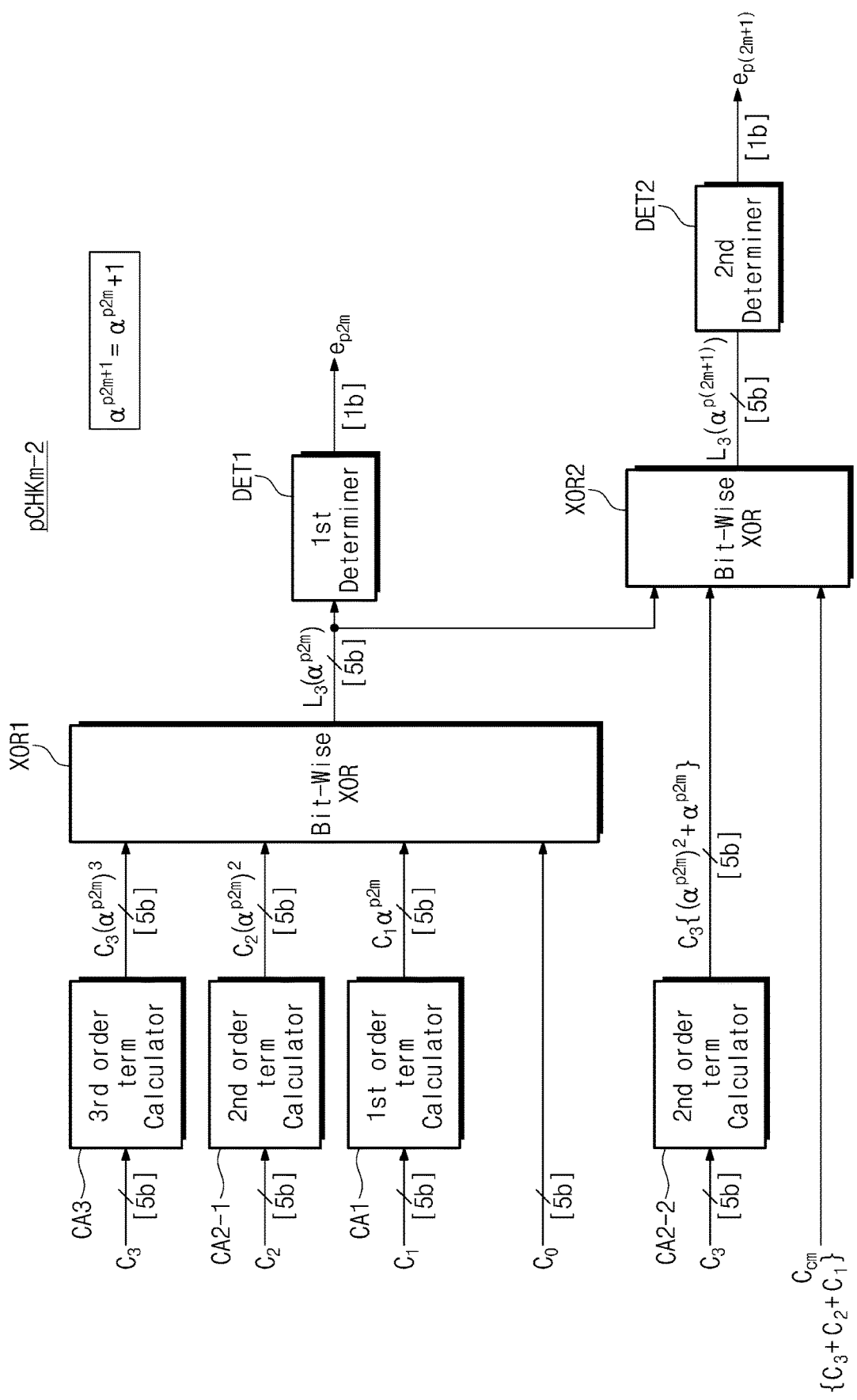
FIGS. 13 and 14 are block diagrams showing a pair checker included in an error vector generator of FIG. 6.
Figure 14:
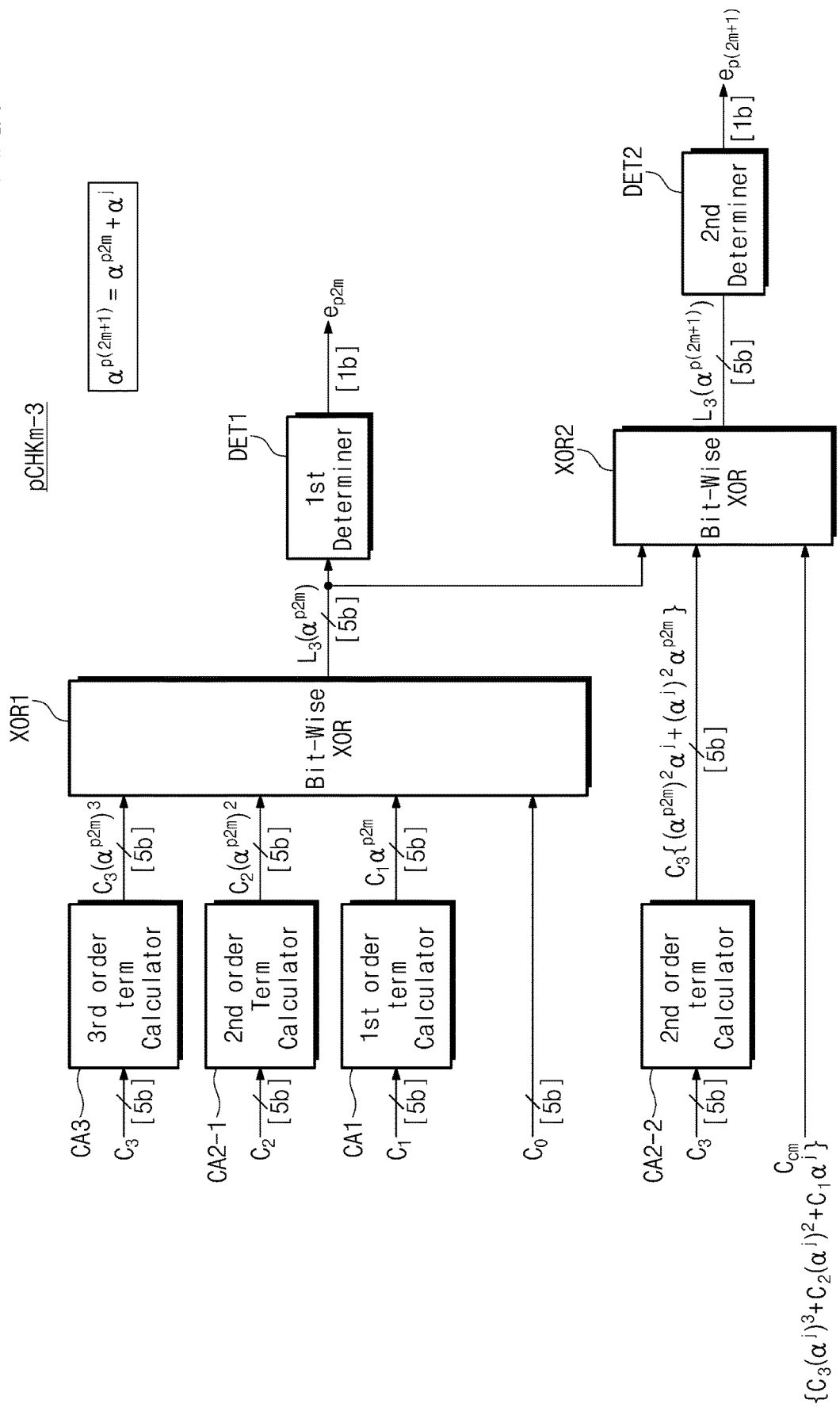

FIGS. 13 and 14 are block diagrams showing a pair checker included in an error vector generator of FIG. 6. In the above-described embodiments, it is described that the ECC circuit 110 corrects the maximum of a 2-bit error. However, the scope of the present disclosure is not limited thereto. For example, the ECC circuit 110 may be configured to correct errors of 3 bits or more.

For example, it is assumed that the ECC circuit 110 corrects the maximum of a 3-bit error. In this case, an error location polynomial operated by the error vector generator 112b may be expressed as Equation 8.

$$L_3(x) = C_3 x^3 + C_2 x^2 + C_1 x^1 + C_0 \quad \text{[Equation 8]}$$

Referring to Equation 8, $L_3(x)$ may be an error location polynomial for detecting a location of a 3-bit error in a data code. $C_3$ may be a coefficient of the 3rd order term for a field element of 'x' and may be "$S_1^3 + S_3$"; $C_2$ may be a coefficient of the 2nd order term for the field element of 'x', and may be "$(S_1^3 + S_3)S_1$"; $C_1$ may be a coefficient of the 1st order term for the field element of 'x', and may be "$S_1^2 S_3 + S_5$"; and, $C_0$ may be a 0-th coefficient (i.e., a constant term) and may be "$(S_1^3 + S_3)^2 + S_1(S_1^2 S_3 + S_5)$". Each of $S_1$, $S_3$, and $S_5$ may be a syndrome $S_y$ operated by the syndrome calculating unit 111 (see FIG. 4). $C_0$, $C_1$, $C_2$, and $C_3$ may be calculated by the coefficient calculator 112a based on the syndrome $S_y$.

When the ECC circuit 110 corrects the maximum of a 3-bit error, as in the above description, one pair checker pCHK may perform an error location operation on two field elements included in one pair. For example, it is assumed that two field elements (e.g., $\alpha^{p2m}$ and $\alpha^{p(2m+1)}$) included in one pair satisfy a condition of "$\alpha^{p(2m+1)} = \alpha^{p2m} + 1$". In this case, a result of the error location operation on two field elements (e.g., $\alpha^{p2m}$ and $\alpha^{p(2m+1)}$) included in one pair may be expressed as in Equation 9.

[Equation 9]

$$\alpha^{p(2m+1)} = \alpha^{p2m} + 1$$

$$L_3(\alpha^{p2m}) = C_3(\alpha^{p2m})^3 + C_2(\alpha^{p2m})^2 + C_1(\alpha^{p2m}) + C_0$$

$$L_3(\alpha^{p(2m+1)}) =$$

$$C_3((\alpha^{p2m})^3 + (\alpha^{p2m})^2 + \alpha^{p2m} + 1) + C_1((\alpha^{p2m})^2 + 1) + C_1(\alpha^{p2m} + 1) + C_0 =$$

$$L_3(\alpha^{p2m}) + C_3(\alpha^{p2m})^2 + C_3\alpha^{p2m} + C_3 + C_2 + C_1$$

Variables of Equation 9 are described above, and thus a detailed description thereof will be omitted to avoid redundancy. As described in Equation 9, a result of error location operation on "$\alpha^{p(2m+1)}$" may be calculated by using a result of an error location operation on "$\alpha^{p2m}$", and such a structure may be similar to that of the above-described embodiments.

For example, as illustrated in FIG. 13, the pair checker pCHKm-2 may include the 1st order term calculator CA1, a first 2nd order term calculator CA2-1, a 3rd order term calculator CA3, the first bit-wise XOR logic XOR1, the first determiner DET1, a second 2nd order term calculator CA2-2, the second bit-wise XOR logic XOR2, and the second determiner DET2.

The 1st order term calculator CA1 may receive the first coefficient $C_1$ from the coefficient calculator 112a and may calculate a 1st order term $C_1\alpha^{p2m}$ by using the first coefficient $C_1$. The first coefficient $C_1$ and the 1st order term $C_1\alpha^{p2m}$ may be a 5-bit binary vector. In an embodiment, the 1st order term $C_1\alpha^{p2m}$ may be a 1st order term for the p2m-th field element $\alpha^{p2m}$ of the error location polynomial $L_2(x)$.

The first 2nd order term calculator CA2-1 may receive the second coefficient $C_2$ from the coefficient calculator 112a and may calculate a 2nd order term $C_2(\alpha^{p2m})^2$ by using the second coefficient $C_2$. The second coefficient $C_2$ and the 2nd order term $C_2(\alpha^{p2m})^2$ may be a 5-bit binary vector. ($C_2(\alpha^{p2m})^2$) may be a 2nd order term for the p2m-th field element $\alpha^{p2m}$ of the error location polynomial $L_2(x)$.

The 3rd order term calculator CA3 may receive a third coefficient $C_3$ from the coefficient calculator 112a and may calculate a 3rd order term $C_3(\alpha^{p2m})^3$ by using the third coefficient $C_3$. The third coefficient $C_3$ and the 3rd order term $C_3(\alpha^{p2m})^3$ may be a 5-bit binary vector.

The first bit-wise XOR logic XOR1 may respectively receive the 1st order term $C_1\alpha^{p2m}$, the 2nd order term $C_2(\alpha^{p2m})^2$, and the 3rd order term $C_3(\alpha^{p2m})^3$ from the 1st order term calculator CA1, the first 2nd order term calculator CA2-1, and the 3rd order term calculator CA3 and may receive the 0-th coefficient $C_0$ from the coefficient calculator 112a. The first bit-wise XOR logic XOR1 may perform a bit-wise XOR operation on the received signals. The operation result $L_3(\alpha^{p2m})$ is provided to the first determiner DET1. The first determiner DET1 may output a p2m-th error vector element $e_{p2m}$ based on the operation result $L_3(\alpha^{p2m})$ of the first bit-wise XOR logic XOR1.

As described with reference to Equation 9, an error location operation result of $\alpha^{p(2m+1)}$ included in a pair together with $\alpha^{p2m}$ may be calculated by using $L_3(\alpha^{p2m})$. In other words, the second 2nd order term calculator CA2-2 may receive the third coefficient $C_3$ from the coefficient calculator 112a and may calculate the 2nd order term $C_3\{(\alpha^{p2m})^2+\alpha^{p2m}\}$ by using the third coefficient $C_3$.

The second bit-wise XOR logic XOR2 may receive the 2nd order term $C_3\{(\alpha^{p2m})^2+\alpha^{p2m}\}$ from the second 2nd order term calculator CA2-2 and may receive the common coefficient $C_{cm}$ from the coefficient calculator 112a. The common coefficient $C_{cm}$ may correspond to the sum of $C_1$, $C_2$, and $C_3$. The second bit-wise XOR logic XOR2 may perform a bit-wise XOR operation on the received signals. The operation result may be $L_3(\alpha^{p(2m+1)})$ and may be provided to the second determiner DET2. The second determiner DET2 may output the (p(2m+1))-th error vector element $e_{p(2m+1)}$ based on the operation result $L_3(\alpha^{p(2m+1)})$.

In an embodiment, two field elements (e.g., $\alpha^{p2m}$ and $\alpha^{p(2m+1)}$) included in one pair may satisfy a condition of "$\alpha^{p(2m+1)}=\alpha^{p2m}+\alpha^j$". In this case, a result of an error location operation of two field elements (e.g., $\alpha^{p2m}$ and $\alpha^{p(2m+1)}$) included in one pair may be expressed as in Equation 10.

[Equation 10]
$$\alpha^{p(2m+1)} = \alpha^{p2m} + \alpha^j$$
$$L_3(\alpha^{p2m}) = C_3(\alpha^{p2m})^3 + C_2(\alpha^{p2m})^2 + C_1(\alpha^{p2m}) + C_0$$
$$L_3(\alpha^{p(2m+1)}) = C_3((\alpha^{p2m})^3 + (\alpha^{p2m})^2\alpha^j + \alpha^{p2m}(\alpha^j)^2 + (\alpha^j)^3) +$$
$$C_1((\alpha^{p2m})^2 + (\alpha^j)^2) + C_1(\alpha^{p2m} + \alpha^j) + C_0 =$$
$$L_3(\alpha^{p2m}) + C_3(\alpha^{p2m})^2\alpha^j + C_3\alpha^{p2m}(\alpha^j)^2 + C_3\alpha^j + C_2\alpha^j + C_1\alpha^j$$

Referring to Equation 10, $\alpha^j$ may indicate one of the field elements of the Galois field $GF(2^5)$ (i.e., a Galois field required to design the H-matrix H-MAT) described with reference to FIG. 5A. The remaining variables are described above, and thus a detailed description thereof will be omitted to avoid redundancy.

As described in Equation 10, a result of error location operation on "$\alpha^{p(2m+1)}$" may be calculated by using a result of an error location operation on "$\alpha^{p(2m+1)}$", and such a structure may be similar to that of the above-described embodiments.

For example, as illustrated in FIG. 14, the pair checker pCHKm−3 may include the 1st order term calculator CA1, the first 2nd order term calculator CA2-1, the 3rd order term calculator CA3, the first bit-wise XOR logic XOR1, the first determiner DET1, the second 2nd order term calculator CA2-2, the second bit-wise XOR logic XOR2, and the second determiner DET2.

The configurations and operations of the 1st order term calculator CA1, the first 2nd order term calculator CA2-1, the 3rd order term calculator CA3, the first bit-wise XOR logic XOR1, and the first determiner DET1 are similar to those described with reference to FIG. 13, and thus a detailed description thereof is omitted to avoid redundancy. The second 2nd order term calculator CA2-2, the second bit-wise XOR logic XOR2, and the second determiner DET2 are similar to those described above except that the 2nd order term $C_3\{(\alpha^{p2m})^2\alpha^j+(\alpha^j)^2\alpha^{p2m}\}$, which is calculated, and the common coefficient $C_{cm}$ (i.e., $C_{cm}=C_3(\alpha^j)^3+C_2(\alpha^j)^2+C_1\alpha^j$) are different from those of FIG. 13, and thus a detailed description thereof is omitted to avoid redundancy.

As described above, according to embodiments of the present disclosure, the ECC circuit 110 may configure a plurality of field elements, which indicate locations of the data code, into pairs so as to satisfy a predetermined rule or a predetermined condition and may perform an error location operation on each pair (i.e., at least two field elements) by using one pair checker. In this case, faster decoding than an ECC decoder based on a Chien-search algorithm in a partial-parallel method is possible. Moreover, a simpler structure than the ECC decoder based on a Chien-search algorithm in a full-parallel method is possible.

Figure 15:
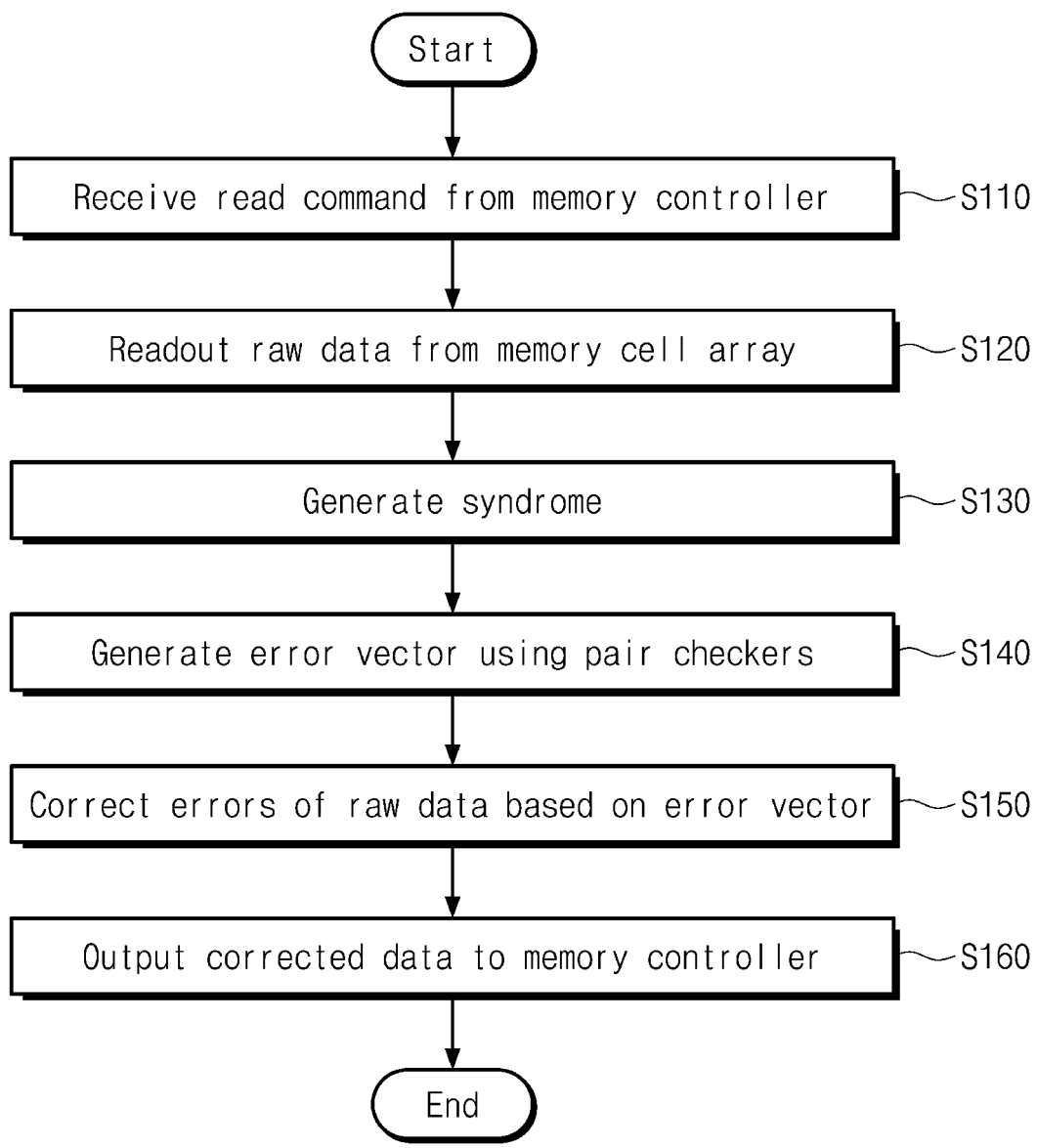
FIG. 15 is a flowchart illustrating an operation of a memory device of FIG. 2.

FIG. 15 is a flowchart illustrating an operation of a memory device of FIG. 2. Referring to FIGS. 2 and 15, in operation S110, the memory device 100 may receive a read command from the memory controller 11. In operation S120, the memory device 100 may read out raw data from the memory cell array 120. For example, the read command received from the memory controller 11 may include information about a read address. The memory device 100 may read out data (i.e., raw data) corresponding to the read address from the memory cell array 120.

In operation S130, the memory device 100 may generate a syndrome. For example, data corresponding to the read address may be a data code including user data and parity data. The ECC circuit 110 of the memory device 100 may generate a plurality of syndromes based on the data code and the H-matrix H-MAT.

In operation S140, the memory device 100 may generate an error vector by using pair checkers. For example, the ECC circuit 110 of the memory device 100 may be implemented as described with reference to FIGS. 1 to 14. That is, a plurality of field elements corresponding to a plurality of bits of the data code may be divided into pair units based on a predetermined rule. In this case, each of the pair checkers of the ECC circuit 110 may perform an error location operation on each pair, and an error vector may be generated based on the operation result of the pair checkers. Operation S140 is described with reference to FIGS. 1 to 14, and thus, an additional description thereof will be omitted to avoid redundancy.

In operation S150, the memory device 100 may correct errors of the raw data based on the error vector. In operation S160, the memory device 100 may transmit the corrected data to the memory controller 11. In an embodiment, when error correction fails by the ECC circuit 110 of the memory device 100 (i.e., when ECC decoding fails), the memory device 100 may notify the memory controller 11 of decoding failure by using information such as a decoding status flag DSF.

Figure 16:
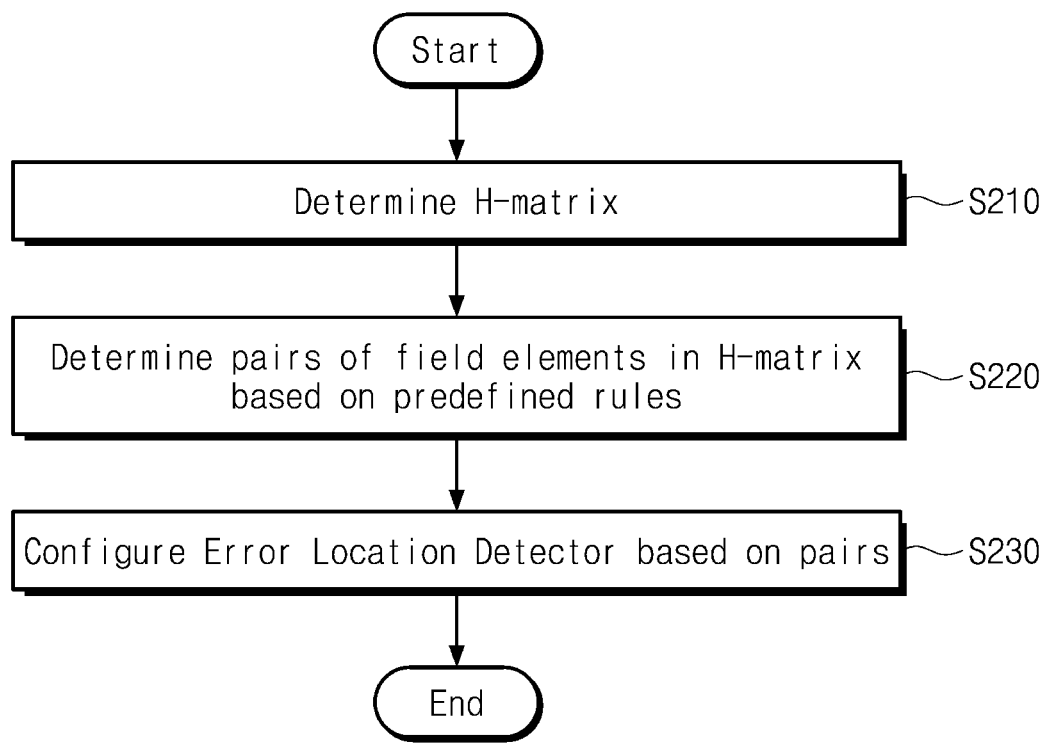
FIG. 16 is a flowchart showing a method for designing an ECC decoder, according to an embodiment of the present disclosure.

FIG. 16 is a flowchart showing a method for designing an ECC decoder, according to an embodiment of the present disclosure. In an embodiment, a flowchart shown in FIG. 16 may be performed by a separate ECC design tool or a memory device design tool. Referring to FIG. 16, in operation S210, the H-matrix H-MAT is determined or designed. For example, the H-matrix H-MAT may be implemented in various forms depending on an error correction capability of the ECC circuit 110 and the length of a data code.

In operation S220, pairs of field elements in the H-matrix may be determined or designed based on predefined rules or predefined conditions. For example, the H-matrix H-MAT may be composed of a plurality of field elements. The plurality of field elements may respectively correspond to locations of a plurality of bits included in the data code. The plurality of field elements may be classified or determined in pair units (i.e., a unit of at least two field elements) based on the method described with reference to FIGS. 1 to 15. In an embodiment, field elements included in one pair may be set to satisfy a predefined rule or a predefined condition. In an embodiment, all field elements included in all pairs may be independent of each other.

In operation S230, an error location detector may be configured based on the determined pairs. For example, when it is determined that a first pair includes a first field element and a second field element, a pair checker that performs an error location operation on the first pair may be configured to search for, detect, determine, or calculate whether the first field element and the second field element are solutions of an error location polynomial. A configuration of a pair checker is described with reference to FIGS. 1 to 15, and thus, an additional description thereof will be omitted to avoid redundancy.

Figure 17:
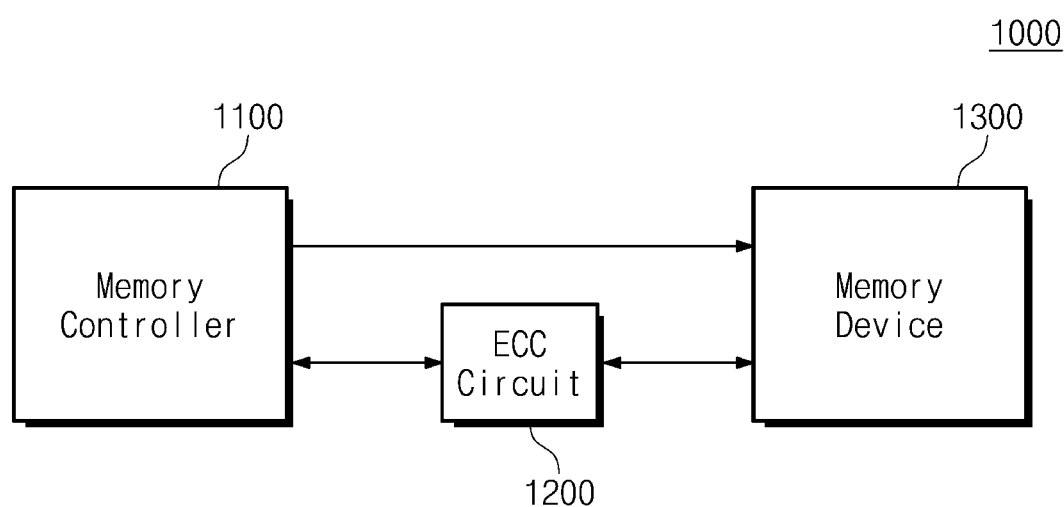
FIG. 17 is a block diagram illustrating a memory system, according to an embodiment of the present disclosure.

FIG. 17 is a block diagram illustrating a memory system, according to an embodiment of the present disclosure. Referring to FIG. 17, a memory system 1000 may include a memory controller 1100, an ECC circuit 1200, and a memory device 1300. The memory controller 1100 may store data in the memory device 1300 or may read out data stored in the memory device 1200.

In an embodiment, the ECC circuit 1200 may be located on a data path between the memory controller 1100 and the memory device 1300. The ECC circuit 1200 may be configured to correct an error of data transmitted and received between the memory controller 1100 and the memory device 1300. In an embodiment, the ECC circuit 1200 may operate based on the operating method described with reference to FIGS. 1 to 16.

Figure 18:
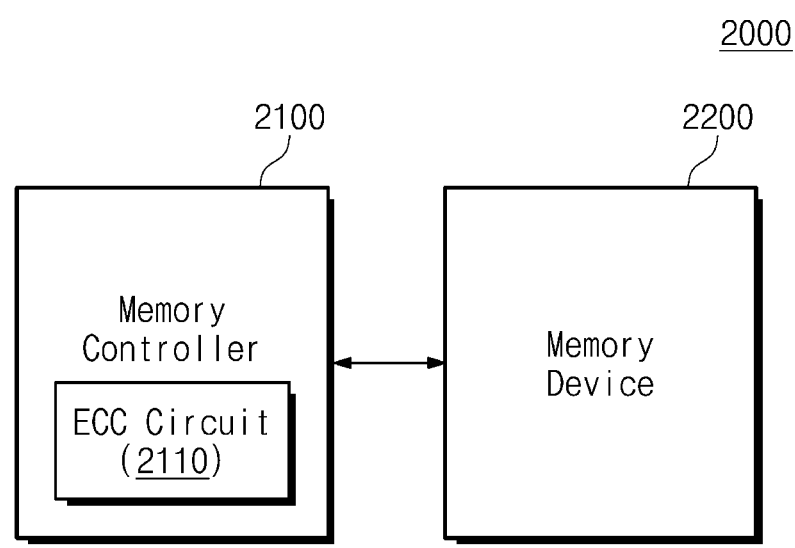
FIG. 18 is a block diagram illustrating a memory system, according to an embodiment of the present disclosure.

FIG. 18 is a block diagram illustrating a memory system, according to an embodiment of the present disclosure. Referring to FIG. 18, a memory system 2000 may include a memory controller 2100 and a memory device 2200. The memory controller 2100 may include an ECC circuit 2110. The ECC circuit 2110 may be configured to generate parity data for data to be stored in the memory device 2200 or to correct an error of data read out based on the data and the parity data read from the memory device 2200. The ECC circuit 2110 may operate based on the method described with reference to FIGS. 1 to 16.

Figure 19:
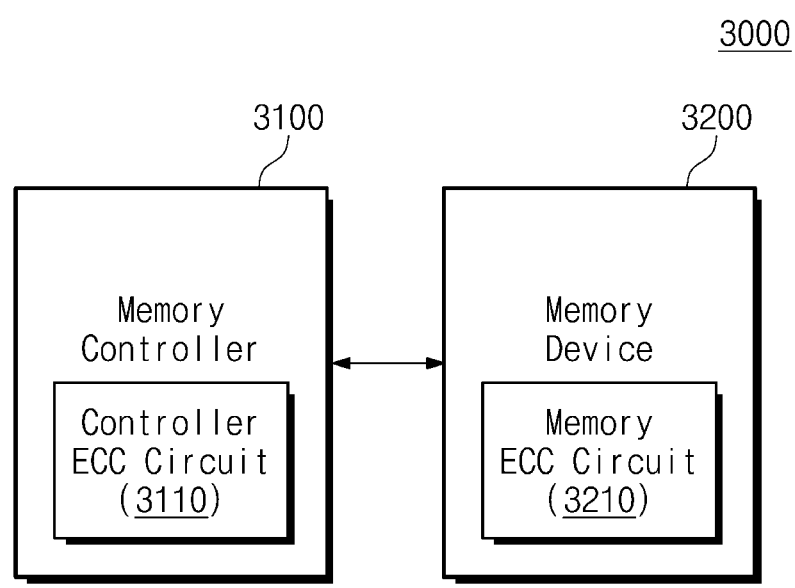
FIG. 19 is a block diagram illustrating a memory system, according to an embodiment of the present disclosure.

FIG. 19 is a block diagram illustrating a memory system, according to an embodiment of the present disclosure. Referring to FIG. 19, a memory system 3000 may include a memory controller 3100 and a memory device 3200. The memory controller 3100 may include a controller ECC circuit 3110. The controller ECC circuit 3110 may generate a first parity for write data to be stored in the memory device 3200 and may correct an error of read data based on the read data and the first parity that are received from the memory device 3200.

The memory device 3200 may include a memory ECC circuit 3210. The memory ECC circuit 3210 may generate a second parity for the write data and the first parity, which are received from the memory controller 3100, and may correct errors of the read data and the first parity based on the read data, the first parity, and the second parity, which are stored in the memory device 3200.

In an embodiment, each of the controller ECC circuit 3110 and the memory ECC circuit 3210 may operate based on the method described with reference to FIGS. 1 to 15. In another embodiment, in the embodiments described with reference to FIGS. 1 to 15, the ECC circuit 110 has been described as an on-die ECC (OD-ECC) circuit included in the memory device 100, but the scope of the present disclosure is not limited thereto. For example, as described with reference to FIGS. 17 to 19, the ECC circuit may be located inside or outside a memory device or within a memory controller.

Figure 20:
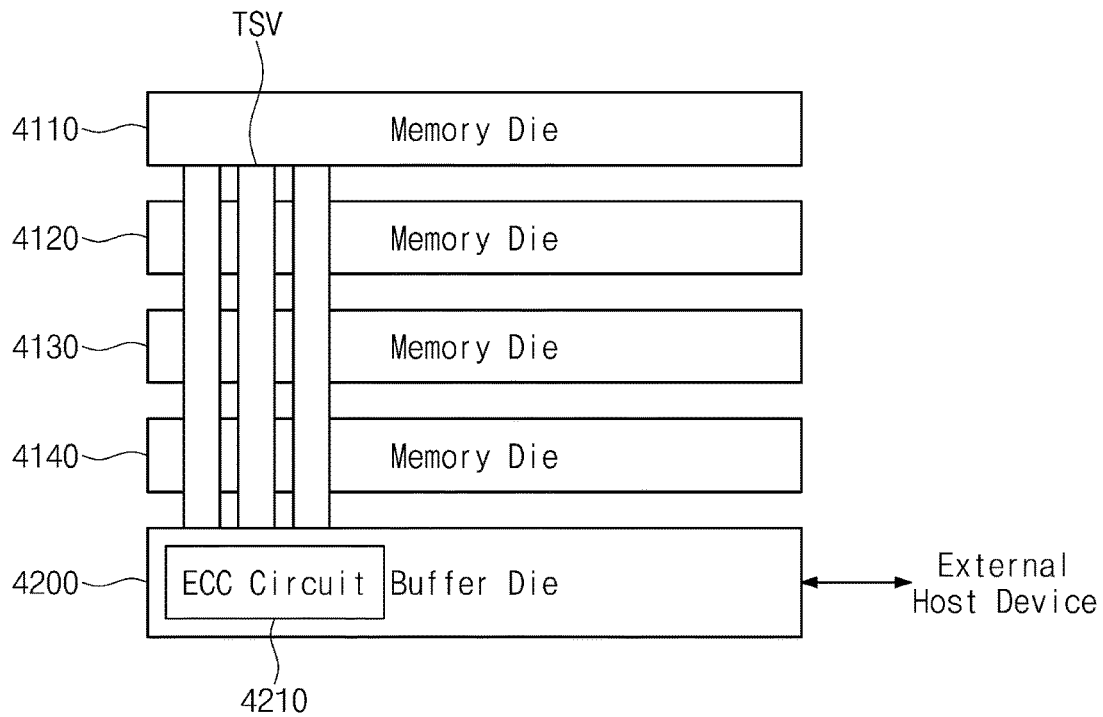
FIG. 20 is a diagram showing some examples of a memory package, according to an embodiment of the present disclosure.

FIG. 20 is a diagram showing some examples of a memory package, according to an embodiment of the present disclosure. Referring to FIG. 20, a memory package 4000 may include a plurality of memory dies 4110 to 4140 and a buffer die 4200. Each of the plurality of memory dies 4110 to 4140 may be a DRAM device. The plurality of memory dies 4110 to 4140 and the buffer die 4200 may be implemented in a stacked structure and may be electrically connected to each other through a through silicon via TSV to communicate with each other.

In an embodiment, the memory package 4000 may be provided as a single semiconductor package by being packaged in a manner such as package on package (POP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flatpack (TQFP), small outline (SOIC), shrink small outline package (SSOP), thin small outline (TSOP), thin quad flatpack (TQFP), system in package (SIP), multi-chip package (MCP), wafer-level fabricated package (WFP), wafer-level processed stack package (WSP), or the like.

The buffer die 4200 may communicate with an external host device (or a memory controller). The buffer die 4200 may be configured to temporarily store data to be stored in the plurality of memory dies 4110 to 4140 or to temporarily store data read out from the plurality of memory dies 4110 to 4140. In an embodiment, the buffer die 4200 may include an ECC circuit 4210. The ECC circuit 4210 may generate a parity for data to be stored in the memory dies 4110 to 4140 or may correct errors of data read out from the memory dies 4110 to 4140. In an embodiment, the ECC circuit 4210 may be implemented or may operate based on the method described with reference to FIGS. 1 to 15.

Figure 21:
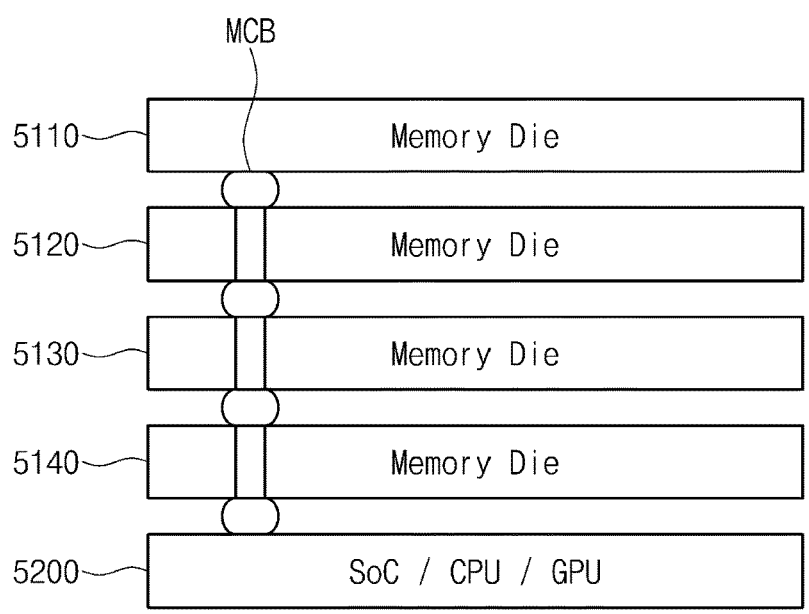
FIG. 21 is a diagram showing some examples of a memory package, according to an embodiment of the present disclosure.

FIG. 21 is a diagram showing some examples of a memory package, according to an embodiment of the present disclosure. Referring to FIG. 21, a memory package 5000 may include a plurality of memory dies 5110 to 5140 and a host die 5200. The plurality of memory dies 5110 to 5140 may be electrically connected to each other through a micro bump MCB, may have a stacked structure, and may be directly stacked on the host die 5200. The host die 5200 may be an SoC, a CPU, or a GPU. In an embodiment, each of the plurality of memory dies 5110 to 5140 or the host die 5200 may include the ECC circuit described with reference to FIGS. 1 to 15.

Figure 22:
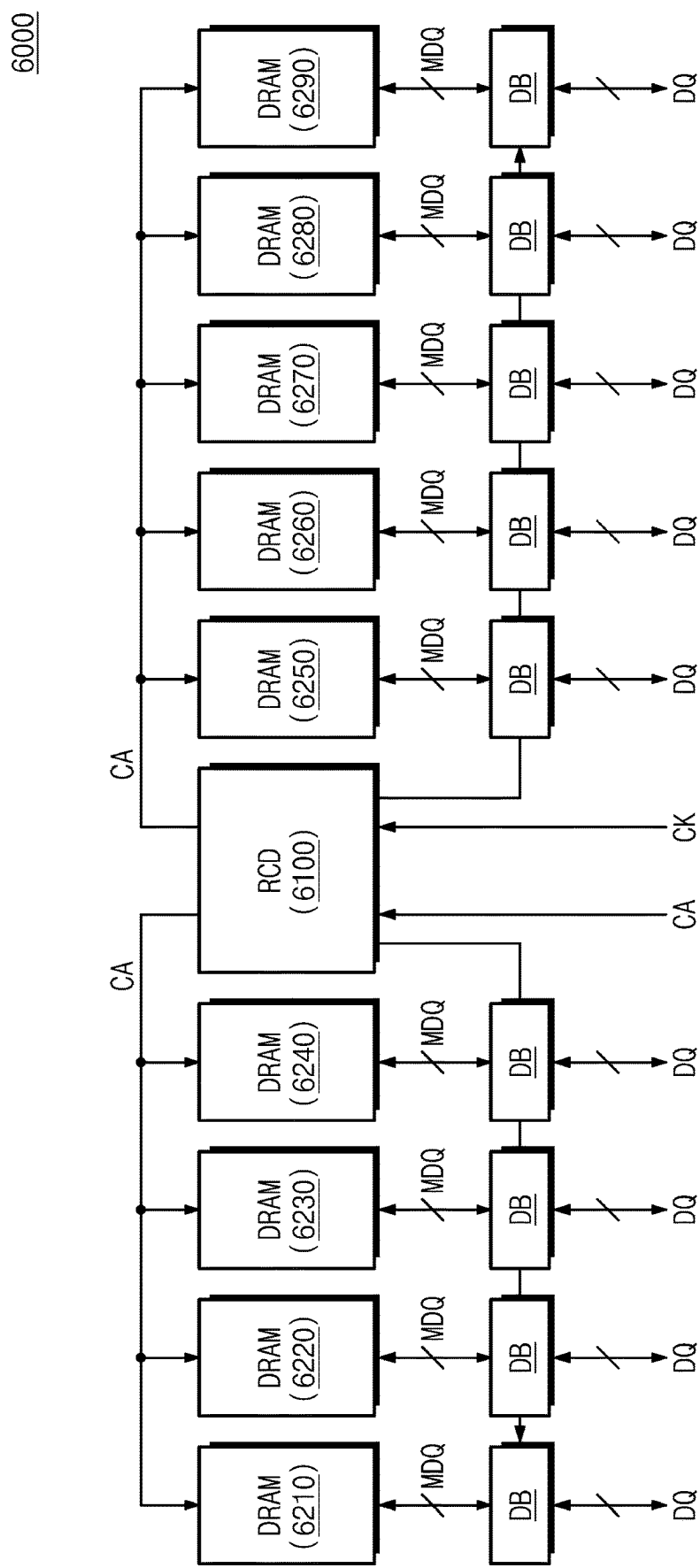
FIG. 22 is a block diagram illustrating a memory module to which a memory device according to an embodiment of the present disclosure is applied.

FIG. 22 is a block diagram illustrating a memory module 6000 to which a memory device according to an embodiment of the present disclosure is applied. Referring to FIG. 22, the memory module 6000 may include a register clock driver RCD 6100, a plurality of memory devices 6210 to 6290, and a plurality of data buffers DB.

The RCD 6100 may receive a command/address CA and a clock signal CK from an external device (e.g., a host or a memory controller). On the basis of the received signals, the RCD 6100 may deliver the command/address CA to the plurality of memory devices 6210 to 6290 and may control the plurality of data buffers DB.

The plurality of memory devices 6210 to 6290 may be respectively connected with the plurality of data buffers DB through memory data lines MDQ.

In an embodiment, each of the plurality of memory devices 6210 to 6290 includes the ECC circuit described with reference to FIGS. 1 to 16 and may operate based on the method described with reference to FIGS. 1 to 16. The plurality of data buffers DB may exchange data with an external device (e.g., a host or a memory controller) through a plurality of data lines DQ.

In an embodiment, the memory module 6000 illustrated in FIG. 22 may have the form factor of a load reduced dual in-line memory module (LRDIMM). However, the scope of the present disclosure is not limited thereto. For example, the memory module 6000 may have the form factor of a registered DIMM (RDIMM) in which the plurality of data buffers DB are not included.

In an embodiment, the memory module 6000 may further include an ECC circuit located outside the plurality of memory devices 6210 to 6290, and the ECC circuit may be configured to operate based on the method described with reference to FIGS. 1 to 16.

In an embodiment, one of the plurality of memory devices 6210 to 6290 may be configured to store parity data. The parity data may be provided from an external device (e.g., a host or a memory controller). In this case, the external device may include the ECC circuit described with reference to FIGS. 1 to 16 or may operate based on the method described with reference to FIGS. 1 to 16.

Figure 23:
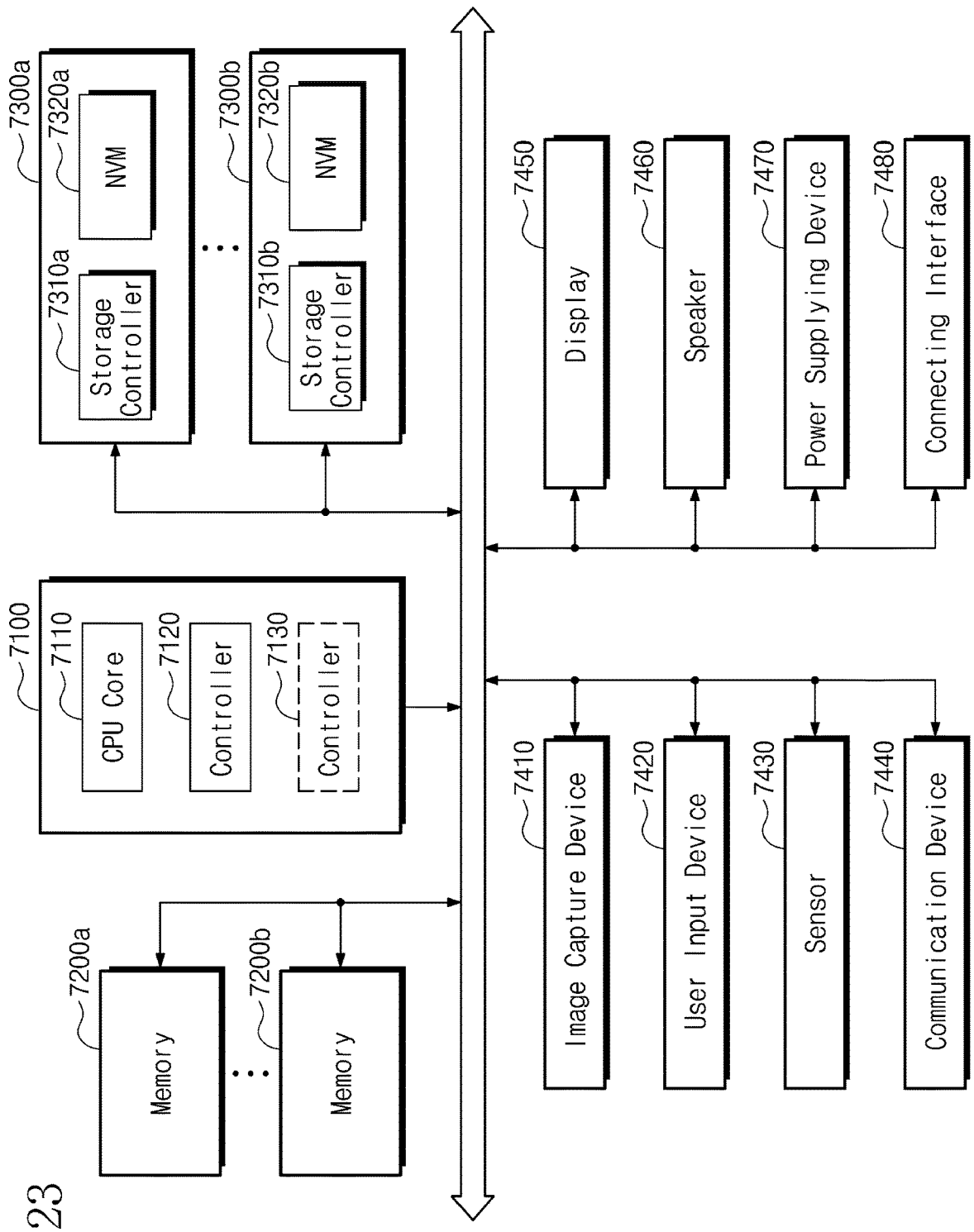
FIG. 23 is a diagram showing a system to which a storage device according to an embodiment of the present disclosure is applied.

FIG. 23 is a diagram of a system 7000 to which a storage device is applied, according to an embodiment. The system 7000 of FIG. 23 may basically be a mobile system, such as a portable communication terminal (e.g., a mobile phone), a smartphone, a tablet personal computer (PC), a wearable device, a healthcare device, or an Internet of things (IOT) device. However, the system 7000 of FIG. 23 is not necessarily limited to the mobile system and may be a PC, a laptop computer, a server, a media player, or an automotive device (e.g., a navigation device).

Referring to FIG. 1, the system 7000 may include a main processor 7100, memories (e.g., 7200a and 7200b), and storage devices (e.g., 7300a and 7300b). In addition, the system 7000 may include at least one of an image capturing device 7410, a user input device 7420, a sensor 7430, a communication device 7440, a display 7450, a speaker 7460, a power supplying device 7470, and a connecting interface 7480.

The main processor 7100 may control all operations of the system 7000, more specifically, operations of other components included in the system 7000. The main processor 7100 may be implemented as a general-purpose processor, a dedicated processor, or an application processor.

The main processor 7100 may include at least one CPU core 7110 and further include a controller 7120 configured to control the memories 7200a and 7200b and/or the storage devices 7300a and 7300b. In some embodiments, the main processor 7100 may further include an accelerator 1130, which is a dedicated circuit for a high-speed data operation, such as an artificial intelligence (AI) data operation. The accelerator 1130 may include a graphics processing unit (GPU), a neural processing unit (NPU) and/or a data processing unit (DPU) and be implemented as a chip that is physically separate from the other components of the main processor 7100.

The memories 7200a and 7200b may be used as main memory devices of the system 7000. Although each of the memories 7200a and 7200b may include a volatile memory, such as static random access memory (SRAM) and/or dynamic RAM (DRAM), each of the memories 7200a and 7200b may include non-volatile memory, such as a flash memory, phase-change RAM (PRAM) and/or resistive RAM (RRAM). The memories 7200a and 7200b may be implemented in the same package as the main processor 7100.

The storage devices 7300a and 7300b may serve as non-volatile storage devices configured to store data regardless of whether power is supplied thereto, and have larger storage capacity than the memories 7200a and 7200b. The storage devices 7300a and 7300b may respectively include storage controllers (STRG CTRL) 7310a and 7310b and NVM (Non-Volatile Memory)s 7320a and 7320b configured to store data via the control of the storage controllers 7310a and 7310b. Although the NVMs 7320a and 7320b may include flash memories having a two-dimensional (2D) structure or a three-dimensional (3D) V-NAND structure, the NVMs 7320a and 7320b may include other types of NVMs, such as PRAM and/or RRAM.

The storage devices 7300a and 7300b may be physically separated from the main processor 7100 and included in the system 7000 or implemented in the same package as the main processor 7100. In addition, the storage devices 7300a and 7300b may have types of solid-state devices (SSDs) or memory cards and be removably combined with other components of the system 100 through an interface, such as the connecting interface 7480 that will be described below. The storage devices 7300a and 7300b may be devices to which a standard protocol, such as a universal flash storage (UFS), an embedded multi-media card (eMMC), or a non-volatile memory express (NVMe), is applied, but without being limited thereto.

The image capturing device 7410 may capture still images or moving images. The image capturing device 7410 may include a camera, a camcorder, and/or a webcam. The user input device 7420 may receive various types of data input by a user of the system 7000 and include a touch pad, a keypad, a keyboard, a mouse, and/or a microphone. The sensor 7430 may detect various types of physical quantities, which may be obtained from the outside of the system 7000, and convert the detected physical quantities into electric signals. The sensor 7430 may include a temperature sensor, a pressure sensor, an illuminance sensor, a position sensor, an acceleration sensor, a biosensor, and/or a gyroscope sensor. The communication device 7440 may transmit and receive signals between other devices outside the system 7000 according to various communication protocols. The communication device 7440 may include an antenna, a transceiver, and/or a modem. The display 7450 and the speaker 7460 may serve as output devices configured to respectively output visual information and auditory information to the user of the system 7000. The power supplying device 7470 may appropriately convert power supplied from a battery (not shown) embedded in the system 7000 and/or an external power source, and supply the converted power to each of components of the system 7000. The connecting interface 7480 may provide connection between the system 7000 and an external device, which is connected to the system 7000 and capable of transmitting and receiving data to and from the system 7000. The connecting interface 7480 may be implemented by using various interface schemes, such as advanced technology attachment (ATA), serial ATA (SATA), external SATA (e-SATA), small computer small interface (SCSI), serial attached SCSI (SAS), peripheral component interconnection (PCI), PCI express (PCIe), NVMe, IEEE 1394, a universal serial bus (USB) interface, a secure digital (SD) card interface, a multi-media card (MMC) interface, an eMMC interface, a UFS interface, an embedded UFS (eUFS) interface, and a compact flash (CF) card interface. In an embodiment, the memories 7200a and 7200b are the memory device including the ECC circuit described in FIGS. 1 to 16, and may operate based on the operation method described in FIGS. 1 to 16.

The above description refers to detailed embodiments for carrying out the present disclosure. Embodiments in which a design is changed simply or which are easily changed may be included in the present disclosure as well as an embodiment described above. In addition, technologies that are easily changed and implemented by using the above embodiments may be included in the present disclosure. While the present disclosure has been described with reference to embodiments thereof, it will be apparent to those of ordinary skill in the art that various changes and modifications may be made thereto without departing from the spirit and scope of the present disclosure as set forth in the following claims.

According to an embodiment of the present disclosure, it is possible to provide an error correction code, which has improved reliability, improved performance, and a simple structure as a decoding circuit configuration of an error correction code circuit is simplified, a memory device including the error correction code, and an operating method of the error correction code.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A memory device, comprising:
a memory cell array; and
an error correction code (ECC) circuit configured to correct an error in a data code read out from the memory cell array, the ECC circuit comprising:
a syndrome calculating circuit configured to operate a plurality of syndromes based on the data code and an H-matrix;
an error location detecting circuit configured to:
generate an error vector based on the plurality of syndromes; and generate a 0-th error vector element corresponding to a 0-th field element by performing a 0-th error location operation on the 0-th field element among a plurality of field elements based on an error location polynomial, and a first error vector element corresponding to a first field element based on a result of the 0-th error location operation; and
an error correcting circuit configured to correct an error within the data code based on the error vector, and output corrected data.

2. The memory device of claim 1, wherein the error location detecting circuit comprises:
a coefficient calculator circuit configured to generate a plurality of coefficients based on the plurality of syndromes; and
an error vector generator circuit configured to generate the error vector based on the plurality of coefficients from the coefficient calculator circuit.

3. The memory device of claim 2, wherein the error vector generator circuit comprises:
a 0-th pair checker configured to generate the 0-th error vector element corresponding to the 0-th field element and the first error vector element corresponding to the first field element, based on the plurality of coefficients.

4. The memory device of claim 3, wherein the 0-th field element and the first field element satisfy Equation 1:
$\alpha^{p1} = \alpha^{p0} + \alpha^j$, where $\alpha^{p0}$ denotes the 0-th field element, $\alpha^{p1}$ denotes the first field element, and $\alpha^j$ denotes one of the plurality of field elements of a Galois field to form the H-matrix.

5. The memory device of claim 4, wherein the 0-th pair checker comprises:
a first order term calculator configured to generate a first order term for the 0-th field element in the error location polynomial based on a first coefficient among the plurality of coefficients;
a second order term calculator configured to generate a second order term for the 0-th field element in the error location polynomial based on a second coefficient among the plurality of coefficients;
a 0-th bit-wise XOR logic configured to output a 0-th result of the error location polynomial for the 0-th field element by performing a bit-wise XOR operation on a 0-th coefficient among the plurality of coefficients, the first order term, and the second order term;
a 0-th determiner circuit configured to generate the 0-th error vector element based on the 0-th result;
a first bit-wise XOR logic circuit configured to output a first result of the error location polynomial for the first field element by performing a bit-wise XOR operation on a first common coefficient among the plurality of coefficients and the 0-th result; and
a first determiner circuit configured to generate the first error vector element based on the first result.

6. The memory device of claim 5, wherein the first coefficient corresponds to a square of a first syndrome; wherein the second coefficient corresponds to the first syndrome; wherein the 0-th coefficient corresponds to a sum of a cube of the first syndrome and a third syndrome; wherein the first common coefficient corresponds to a sum of a product of the $\alpha^j$ and the first syndrome, and a product of a square of the first syndrome and the $\alpha^j$; wherein the first syndrome corresponds to a product of the data code and an upper portion matrix of the H-matrix; and wherein the third syndrome corresponds to a product of the data code and a lower portion matrix of the H-matrix.

7. The memory device of claim 5, wherein the error vector generator further comprises:
a first pair checker configured to generate a second error vector element corresponding to a second field element and a third error vector element corresponding to a third field element, based on the plurality of coefficients; and
wherein the second field element and the third field element satisfy Equation 2:
$\alpha^{p3} = \alpha^{p2} + \alpha^j$, where $\alpha^{p2}$ denotes the second field element, $\alpha^{p3}$ denotes the third field element, and $\alpha^j$ denotes the one of the plurality of field elements of the Galois field to form the H-matrix.

8. The memory device of claim 7, wherein each of the 0-th field element, the first field element, the second field element, and the third field element correspond to one of a plurality of columns of the H-matrix; and wherein the 0-th field element, the first field element, the second field element, and the third field element are binary vectors independent of each other.

9. The memory device of claim 7, wherein the first pair checker comprises:
a first order term calculator configured to generate a first order term for the second field element in the error location polynomial based on the first coefficient;
a second order term calculator configured to generate a second order term for the 0-th field element in the error location polynomial based on the second coefficient;
a second bit-wise XOR logic circuit configured to output a second result of the error location polynomial for the second field element by performing a bit-wise XOR operation on the 0-th coefficient, a first order term for the second field element, and a second order term for the second field element;
a second determiner circuit configured to generate the second error vector element based on the second result;
a third bit-wise XOR logic circuit configured to output a third result of the error location polynomial for the third field element by performing a bit-wise XOR operation on the first common coefficient and the second result; and
a third determiner circuit configured to generate the third error vector element based on the third result.

10. The memory device of claim 5, wherein the 0-th pair checker is configured to generate a second error vector element for a second field element.

11. The memory device of claim 10, wherein the 0-th field element and the second field element satisfy Equation 3:
$\alpha^{p2}=\alpha^{p0}+\alpha^{k}$, where $\alpha^{p0}$ denotes the 0-th field element, $\alpha^{p2}$ denotes the second field element, and $\alpha^{k}$ denotes one, which is different from the $\alpha^{j}$, from among the plurality of field elements of the Galois field to form the H-matrix.

12. The memory device of claim 11, wherein the 0-th pair checker further comprises:
a second bit-wise XOR logic circuit configured to output a second result of the error location polynomial for the second field element by performing a bit-wise XOR operation on the first common coefficient and the 0-th result; and
a second determiner circuit configured to generate the second error vector element based on the second result.

13. The memory device of claim 5, wherein the 0-th pair checker comprises:
a third order term calculator configured to generate a third order term for the 0-th field element in the error location polynomial based on a third coefficient among the plurality of coefficients; and
wherein the 0-th bit-wise XOR logic circuit is configured to output a 0-th result of the error location polynomial for the 0-th field element by performing a bit-wise XOR operation on the 0-th coefficient, the first order term, the second order term, and the third order term.

14. The memory device of claim 1, further comprising:
a command/address (CA) buffer configured to receive and buffer CA signals from an external device;
an address decoder configured to receive an address signal from the CA buffer and to decode the address signal;
a command decoder configured to receive a command signal from the CA buffer and to decode the command signal;
a row decoder configured to control a plurality of word lines connected to the memory cell array depending on the address decoding result of the address decoder;
a column decoder configured to control a plurality of bit lines connected to the memory cell array depending on the address decoding result of the address decoder; and
a sense amplifier and write driver configured to read out the data code stored in the memory cell array under control of the command decoder.

15. The memory device of claim 14, further comprising:
an I/O circuit configured to output data, in which the error is corrected by the ECC circuit, to the external device in synchronization with a data strobe signal.

16. An ECC circuit configured to correct an error in a data code stored in a memory device, comprising:
a syndrome generating circuit configured to generate a plurality of syndromes based on the data code read out from the memory device and a H-matrix;
an error location detecting circuit configured to generate an error vector based on the plurality of syndromes and a plurality of field elements of the H-matrix, the error location detecting circuit including a coefficient calculator configured to generate a plurality of coefficients used in an error location polynomial based on the plurality of syndromes, and an error vector generator configured to generate the error vector based on the plurality of coefficients; and
an error correcting circuit configured to correct an error of the data code based on the error vector;
wherein the error vector generator includes a plurality of pair checkers configured to perform an error location operation on a plurality of pairs;
wherein the plurality of pairs includes at least two field elements among the plurality of field elements;
wherein the at least two field elements included in each of the plurality of pairs satisfy a predetermined condition; and
wherein each of the plurality of pair checkers is configured to generate one error vector element corresponding to one of the at least two field elements by performing a 0-th error location operation on one of the at least two field elements based on the error location polynomial, and another error vector element corresponding to other one of the at least two field elements based on a result of the 0-th error location operation.

17. The ECC circuit of claim 16, wherein a length of the data code is a first number of bits, and a number of the plurality of pair checkers is a second number, and
wherein the second number is a natural number less than the first number of bits.

18. The ECC circuit of claim 16,
wherein a m-th pair among the plurality of pairs includes a 2m-th field element and a (2m+1)-th field element among the plurality of field elements, where m is a non-negative integer; and
wherein the 2m-th field element and the (2m+1)-th field element satisfy Equation 4:
$\alpha^{p2m+1}=\alpha^{p2m}+\alpha^{j}$, where $\alpha^{p2m}$ denotes the 2m-th field element, $\alpha^{p2m+1}$ denotes the (2m+1)-th field element, and $\alpha^{j}$ denotes one of the plurality of field elements of a Galois field to form the H-matrix.

19. The ECC circuit of claim 18, wherein a m-th pair checker among the plurality of pair checkers includes:
a first order term calculator configured to generate a first order term for the 2m-th field element in the error location polynomial based on a first coefficient among the plurality of coefficients;

a second order term calculator configured to generate a second order term for the 2m-th field element in the error location polynomial based on a second coefficient among the plurality of coefficients;

a 2m-th bit-wise XOR logic circuit configured to generate a 2m-th result of the error location polynomial for the 2m-th field element by performing a bit-wise XOR operation on a 0-th coefficient among the plurality of coefficients, the first order term, and the second order term;

a 2m-th determiner circuit configured to generate a 2m-th error vector element among a plurality of error vector elements of the error vector based on the 2m-th result;

a (2m+1)-th bit-wise XOR logic circuit configured to generate a (2m+1)-th result of the error location polynomial for the (2m+1)-th field element by performing a bit-wise XOR operation on a common coefficient among the plurality of coefficients and the 2m-th result; and a (2m+1)-th determiner circuit configured to generate a (2m+1)-th error vector element among the plurality of error vector elements of the error vector based on the (2m+1)-th result.

20. An operating method of an ECC circuit, comprising:

generating a plurality of syndromes based on a data code;

generating an error vector based on the plurality of syndromes, by generating a first error vector element corresponding to a first field element by performing an error location operation on the first field element based on the plurality of syndromes, and generating a second error vector element corresponding to a second field element based on a result of an error location operation on the first field element; and correcting an error in the data code based on the error vector.

* * * * *